(12) United States Patent
Matsuoka

(10) Patent No.: US 9,711,481 B2
(45) Date of Patent: Jul. 18, 2017

(54) SEMICONDUCTOR DEVICE AND SEMICONDUCTOR DEVICE MOUNTING STRUCTURE

(71) Applicant: ROHM CO., LTD., Kyoto (JP)

(72) Inventor: Yasufumi Matsuoka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 73 days.

(21) Appl. No.: 14/613,473

(22) Filed: Feb. 4, 2015

(65) Prior Publication Data

US 2015/0155253 A1    Jun. 4, 2015

Related U.S. Application Data

(63) Continuation of application No. 13/406,527, filed on Feb. 27, 2012, now Pat. No. 8,963,304.

(30) Foreign Application Priority Data

Feb. 28, 2011    (JP) .................................. 2011-41453

(51) Int. Cl.
*H01L 21/60* (2006.01)
*H01L 27/088* (2006.01)
(Continued)

(52) U.S. Cl.
CPC ............ *H01L 24/49* (2013.01); *H01L 23/293* (2013.01); *H01L 23/495* (2013.01);
(Continued)

(58) Field of Classification Search
CPC .......... H01L 2224/73265; H01L 24/49; H01L 24/45; H01L 29/78; H01L 23/293;
(Continued)

(56) References Cited

U.S. PATENT DOCUMENTS 7,176,506 B2    2/2007  Beroz et al.
2008/0246130 A1  10/2008 Carney et al.
(Continued)

FOREIGN PATENT DOCUMENTS

JP    2002-076195 A    3/2002
JP    2004-193476 A    7/2004
(Continued)

*Primary Examiner* — Marcos D Pizarro
*Assistant Examiner* — Nelson Garces
(74) *Attorney, Agent, or Firm* — Rabin & Berdo, P.C.

(57) ABSTRACT

A semiconductor device includes a plurality of functional element chips, an electric connection member joined to two of the functional element chips, a first wire and a resin configured to cover the functional element chips, the electric connection member and the first wire. One of the two functional element chips may be a first semiconductor chip having first and second major surface electrodes facing toward the same direction and a first rear surface electrode facing in a direction opposite to a direction in which the first major surface electrode faces. The electric connection member may be joined to the first major surface electrode. The first wire may be joined to the second major surface electrode. The first wire may include a portion overlapping with the electric connection member in a thickness direction of the first semiconductor chip.

22 Claims, 44 Drawing Sheets

(51) Int. Cl.
  *H01L 23/52* (2006.01)
  *H01L 23/28* (2006.01)
  *H01L 23/00* (2006.01)
  *H01L 23/495* (2006.01)
  *H01L 23/29* (2006.01)
  *H01L 29/78* (2006.01)
  *H01L 23/31* (2006.01)

(52) U.S. Cl.
  CPC .. *H01L 23/49524* (2013.01); *H01L 23/49562* (2013.01); *H01L 23/49575* (2013.01); *H01L 24/45* (2013.01); *H01L 24/73* (2013.01); *H01L 24/92* (2013.01); *H01L 29/78* (2013.01); *H01L 23/3107* (2013.01); *H01L 24/48* (2013.01); *H01L 2224/0603* (2013.01); *H01L 2224/14133* (2013.01); *H01L 2224/16245* (2013.01); *H01L 2224/291* (2013.01); *H01L 2224/32245* (2013.01); *H01L 2224/45144* (2013.01); *H01L 2224/45147* (2013.01); *H01L 2224/48101* (2013.01); *H01L 2224/48247* (2013.01); *H01L 2224/49* (2013.01); *H01L 2224/73207* (2013.01); *H01L 2224/73253* (2013.01); *H01L 2224/73265* (2013.01); *H01L 2224/92247* (2013.01); *H01L 2924/00014* (2013.01); *H01L 2924/014* (2013.01); *H01L 2924/01029* (2013.01); *H01L 2924/01033* (2013.01); *H01L 2924/01047* (2013.01); *H01L 2924/01079* (2013.01); *H01L 2924/01082* (2013.01); *H01L 2924/1306* (2013.01); *H01L 2924/181* (2013.01); *H01L 2924/30101* (2013.01); *H01L 2924/30107* (2013.01)

(58) Field of Classification Search
  CPC ... H01L 23/49575; H01L 24/73; H01L 24/92; H01L 23/49524; H01L 23/49562; H01L 23/495; H01L 2924/00014; H01L 2224/0603; H01L 2924/181
  USPC .................................................. 257/671–681
  See application file for complete search history.

(56) References Cited

U.S. PATENT DOCUMENTS

2010/0308421 A1* 12/2010 Muto .................... H01L 25/074
                                                257/401
2011/0081750 A1*  4/2011 Machida ............. H01L 21/4842
                                                438/123
2014/0084436 A1*  3/2014 Funatsu ................. H01L 24/40
                                                257/676

FOREIGN PATENT DOCUMENTS

| JP | 2005-294464 A | 10/2005 |
| JP | 2006-049542 A | 2/2006 |
| JP | 2006-156748 A | 6/2006 |
| JP | 2008-130750 A | 6/2008 |
| JP | 2008-182074 A | 8/2008 |
| JP | 2008-270844 A | 11/2008 |
| JP | 2008-300627 A | 12/2008 |
| JP | 2009-224560 A | 10/2009 |
| JP | 2010-283236 A | 12/2010 |

* cited by examiner

FIG. 36
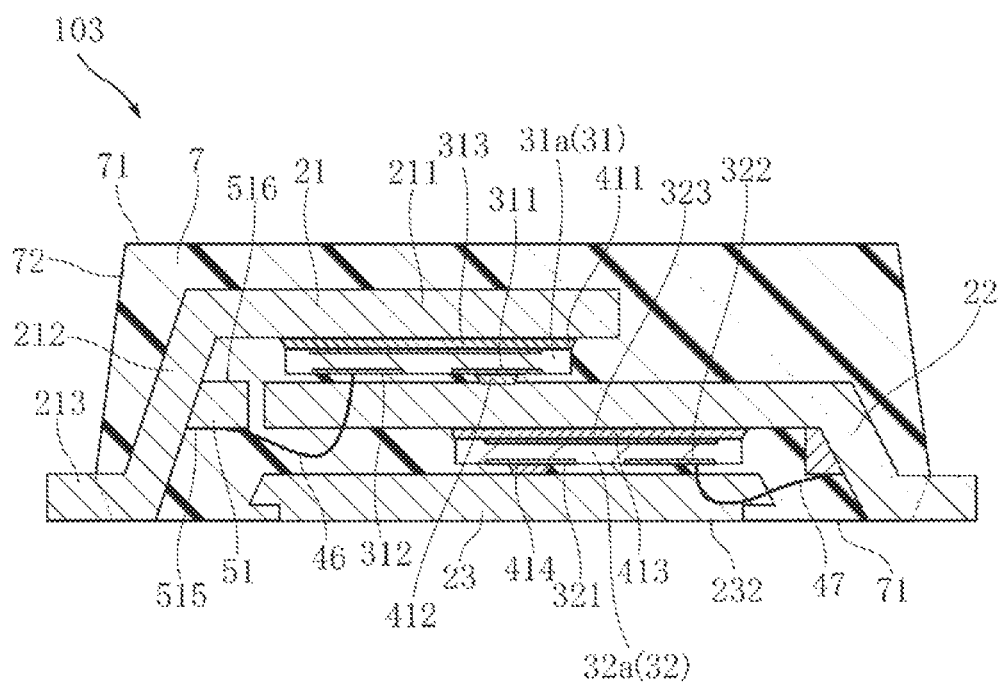
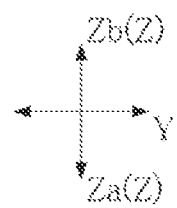

FIG. 37
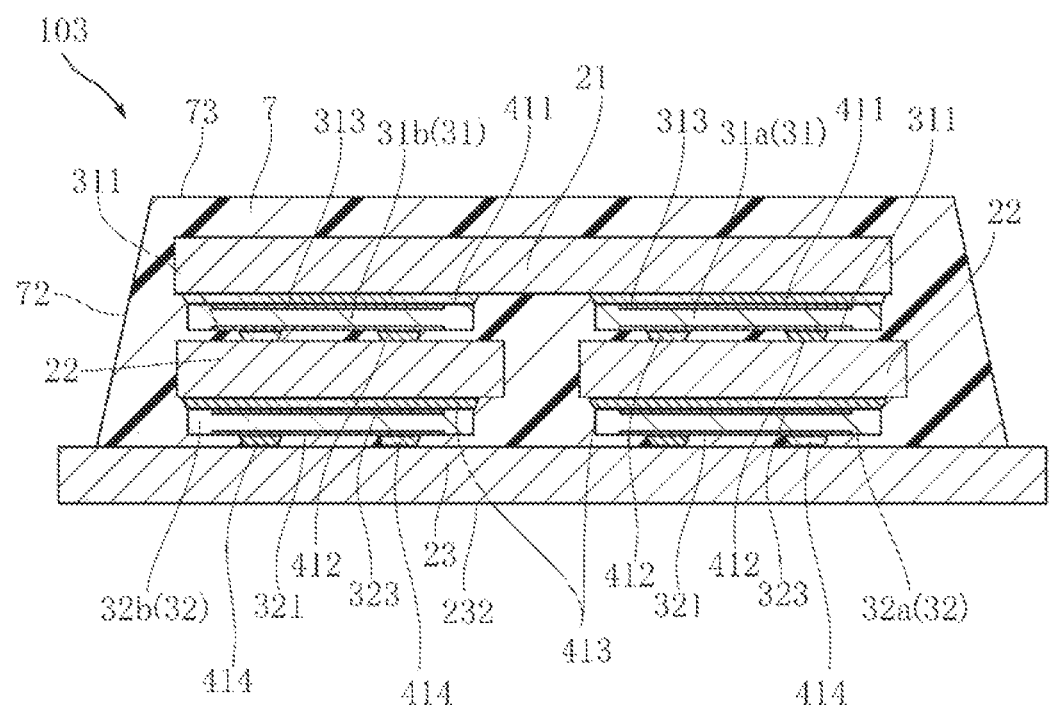
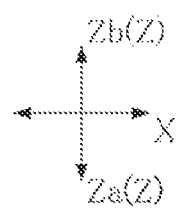

FIG. 43
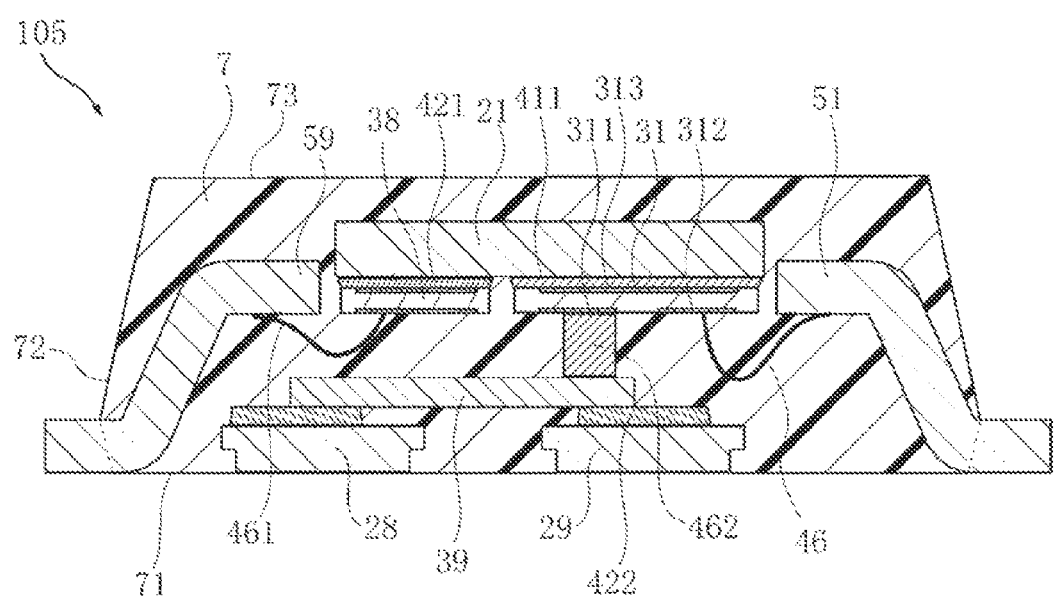
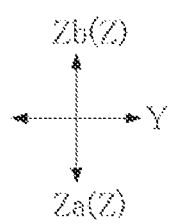

SEMICONDUCTOR DEVICE AND SEMICONDUCTOR DEVICE MOUNTING STRUCTURE

CROSS-REFERENCE TO RELATED APPLICATION

This is a Continuation of U.S. application Ser. No. 13/406,527, filed on Feb. 27, 2012, and allowed on Oct. 15, 2014, the subject matter of which is incorporated herein by reference. The parent application Ser. No. 13/406,527 is based upon and claims the benefit of priority from Japanese Patent Application No. 2011-041453, filed on Feb. 28, 2011, the entire contents of which are incorporated herein by reference.

TECHNICAL FIELD

The present disclosure relates to a semiconductor device and a semiconductor device mounting structure.

BACKGROUND

Various kinds of electronic circuits have been used. Electronic circuits are often realized by using a plurality of functional element chips such as transistors and diodes. The functional element chips may be used in the form of modules covered with a resin. Each of the modules may include one functional element chip. In order to electrically interconnect different functional element chips when an electric circuit is configured by modules, it is necessary to pass through, for example, wiring lines of a printed circuit board.

Wiring resistance and wiring inductance exist in the wiring lines of the printed circuit board. Therefore, if different functional element chips are electrically connected to each other via wiring lines of the printed circuit board as mentioned above, wiring resistance and wiring inductance may be generated in the wiring lines of the printed circuit board. The wiring resistance and the wiring inductance are major causes for hampering reduction of power consumption in an electronic circuit and enhancement of performance of an electronic circuit.

SUMMARY

The present disclosure provides various embodiments of a semiconductor device capable of reducing wiring resistance and wiring inductance.

According to one aspect of the present disclosure, e is provided a semiconductor device. The semiconductor device includes a plurality of functional element chips, an electric connection member joined to at least two of the plurality of functional element chips, a first wire, and a resin. The resin is configured to cover the plurality of functional element chips, the electric connection member and the first wire. One of the at least two functional element chips is a first semiconductor chip including first and second major surface electrodes facing toward the same direction and a first rear surface electrode facing a direction opposite to a direction which the first major surface electrode faces. The electric connection member is joined to the first major surface electrode. The first wire is bonded to the second major surface electrode and includes a portion overlapping with the electric connection member in a thickness direction of the first semiconductor chip.

In one embodiment, the electric connection member may be a first conductor plate and another one of the at least two functional element chips may be a second semiconductor chip.

In another embodiment, the device may further include a wire bonding lead exposed from the resin, and the wire bonding lead may include a pad portion having a pad major surface to which the first wire is bonded.

In another embodiment, the pad major surface may be positioned at a side closer to the first major surface electrode than the first rear surface electrode in the thickness direction.

In another embodiment, the resin may have a resin bottom surface facing toward one direction in the thickness direction and the wire bonding lead may include a mounting portion exposed from the resin bottom surface.

In another embodiment, the mounting portion may have a mounting surface flush with the resin bottom surface.

In another embodiment, the wire bonding lead may include an intermediate portion positioned between the pad portion and the mounting portion. The intermediate portion is inclined with respect to the resin bottom surface.

In another embodiment, the pad major surface may face toward the side where the resin bottom surface is located.

In another embodiment, the pad portion may have a pad rear surface formed at the opposite side from the pad major surface. The pad rear surface faces toward the side where the resin bottom surface is located.

In another embodiment, the second semiconductor chip may be arranged in a position shifted from the first semiconductor chip when seen in the thickness direction.

In another embodiment, the first conductor plate may have a recess portion in which a portion of the first wire is arranged.

In another embodiment, the first major surface electrode may be a gate electrode. In addition, the second major surface electrode may be a source electrode and the first rear surface electrode may be a drain electrode.

In another embodiment, the device may further include a second conductor plate. In this configuration, the second semiconductor chip may include a third major surface electrode facing toward the same direction as the direction which the first major surface electrode faces and a second rear surface electrode facing a direction opposite to a direction which the third major surface electrode faces. Further, the third major surface electrode may be joined to the second conductor plate, and the second rear surface electrode may be joined to the first conductor plate.

In another embodiment, the second conductor plate may have a first conductor surface joined to the third major surface electrode and a second conductor surface facing a direction opposite to a direction which the first conductor surface faces, the second conductor surface being exposed from the resin.

In another embodiment, the first conductor surface may have a portion protruding from the second conductor surface when seen in the thickness direction.

In another embodiment, the device may further include a second wire. With this configuration, the second semiconductor chip may include a fourth major surface electrode facing toward the same direction as the direction which the third major surface electrode faces. In addition, the second wire may be bonded to the fourth major surface electrode, and overlap with the second conductor plate in the thickness direction.

In another embodiment, the device may further include a second conductor plate. In this configuration, the second semiconductor chip may include a third major surface electrode facing toward the same direction as the direction which the first rear surface electrode faces and a second rear surface electrode facing a direction opposite to the direction which the third major surface electrode faces. Further, the third major surface electrode may be joined to the second conductor plate, and the second rear surface electrode may be joined to the first conductor plate.

In another embodiment, the first conductor plate may have a first conductor surface joined to the first major surface electrode and a second conductor surface formed at the opposite side from the first major surface electrode. With this configuration, the second conductor surface may be exposed from the resin.

In another embodiment, the first conductor surface may have a portion protruding from the second conductor surface when seen in the thickness direction.

In another embodiment, the device may further include a second wire. In this configuration, the second semiconductor chip may include a fourth major surface electrode facing toward the same direction as the direction which the third major surface electrode faces. In addition, the second wire may be bonded to the fourth major surface electrode, and overlap with the second conductor plate in the thickness direction.

In another embodiment, the first conductor plate may have a hole which a portion of the resin may have been filled.

In another embodiment, the third major surface electrode may be agate electrode. In addition, the fourth major surface electrode may be a source electrode, and the second rear surface electrode may be a drain electrode.

In another embodiment, one of the functional element chips may be a diode, a resistor or a capacitor.

According to another aspect of the present disclosure, there is provided a semiconductor device mounting structure, including the semiconductor device provided according to the one of the aspects of the present disclosure described above, a wiring substrate on which the semiconductor device is arranged, and a solder layer interposed between the semiconductor device and the wiring substrate.

Other features and advantages of the present disclosure will become apparent from the following detailed description made with reference to the accompanying drawings.

BRIEF DESCRIPTION OF THE DRAWINGS

FIG. 36 is a section view taken along line XXXVI-XXXVI in FIG. 35.

FIG. 37 is a section view taken along line XXXVII-XXXVII in FIG. 35.

FIG. 43 is a section view showing a semiconductor device according to some other embodiments.

DETAILED DESCRIPTION

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

First Embodiment

A first embodiment is now described with reference to FIGS. 1 through 17.

Figure 1:
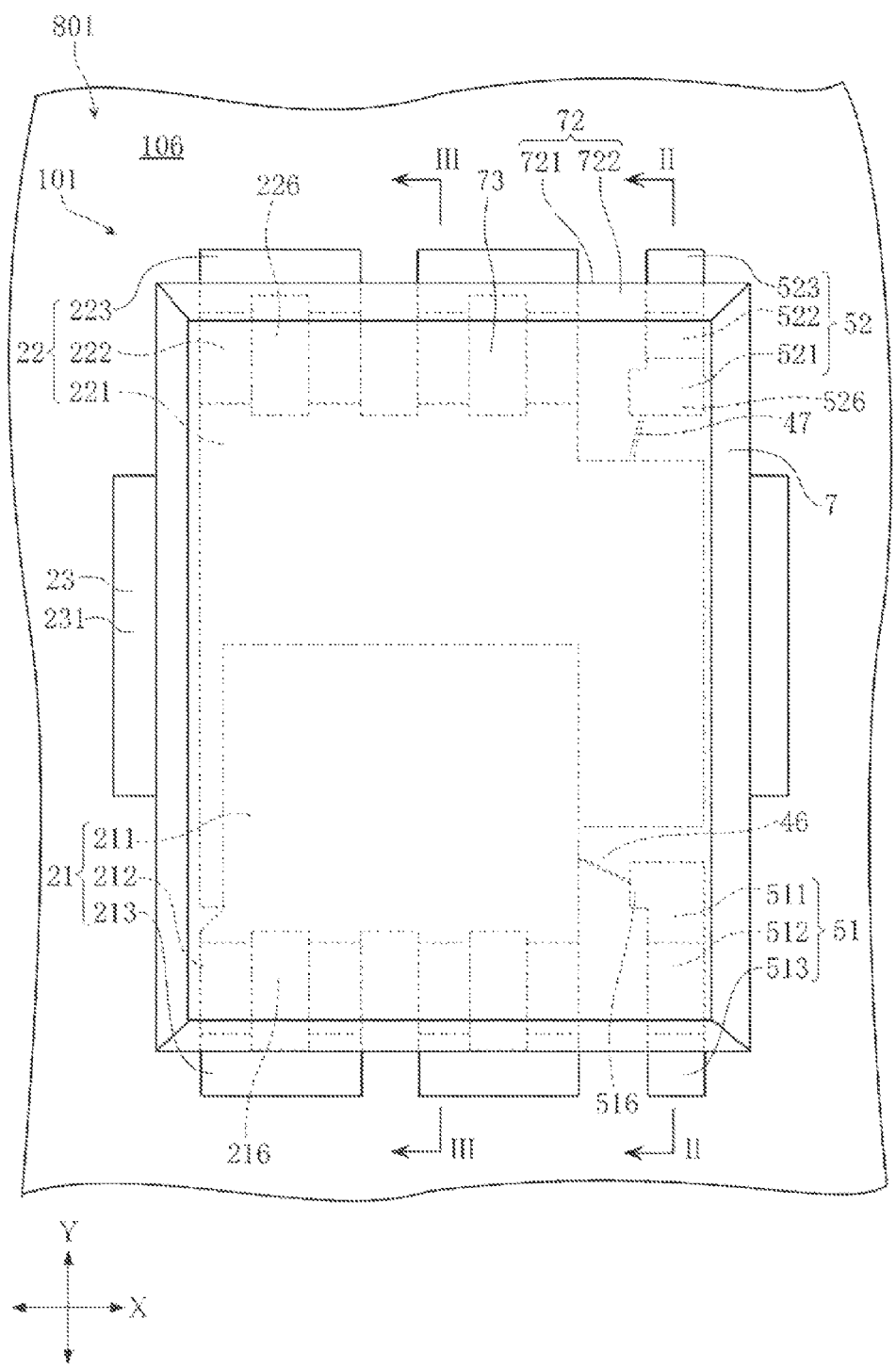
FIG. 1 is a plan view showing a mounting structure according to some embodiments.
Figure 2:
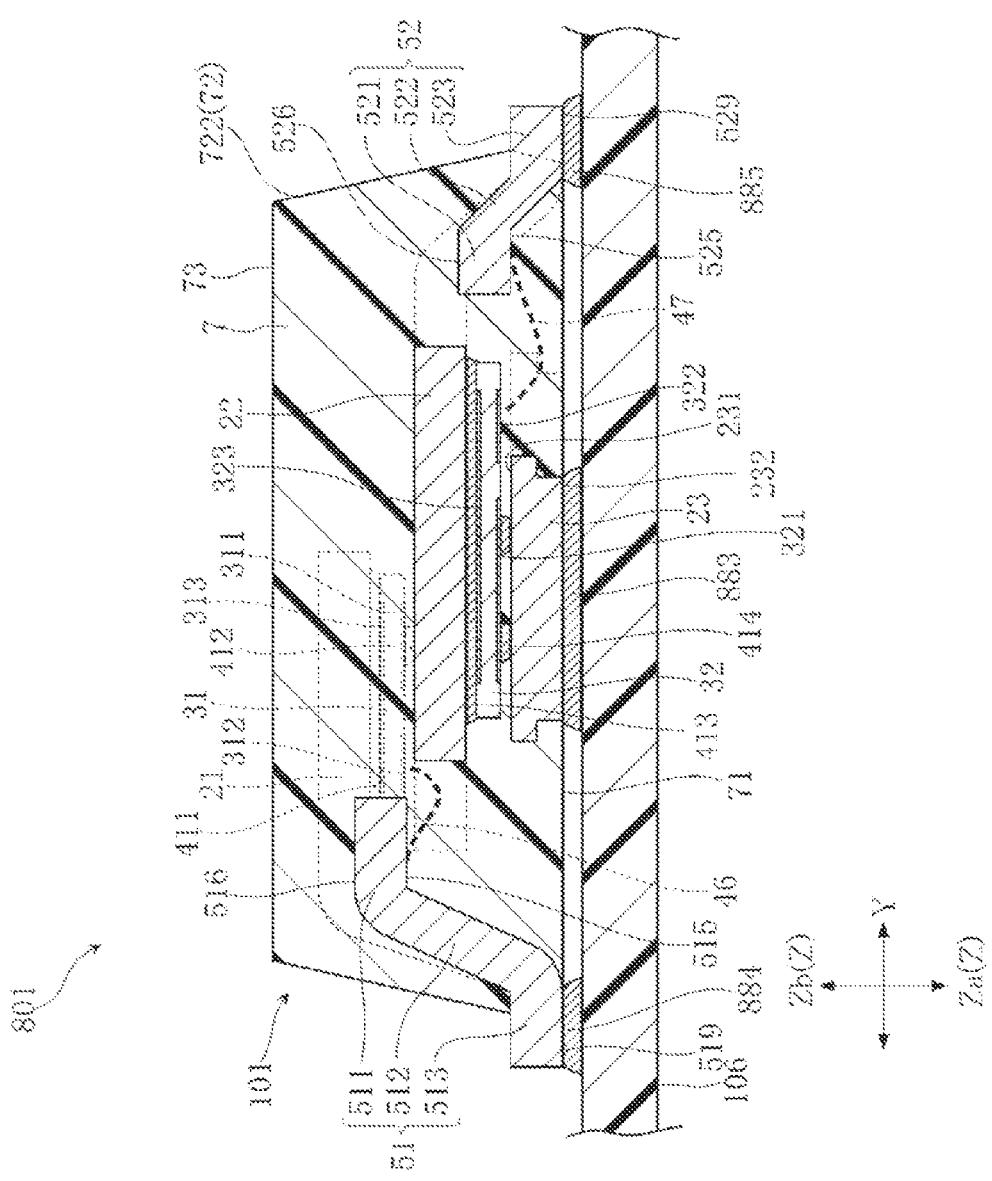
FIG. 2 is a section view taken along like II-II in FIG. 1.
Figure 3:
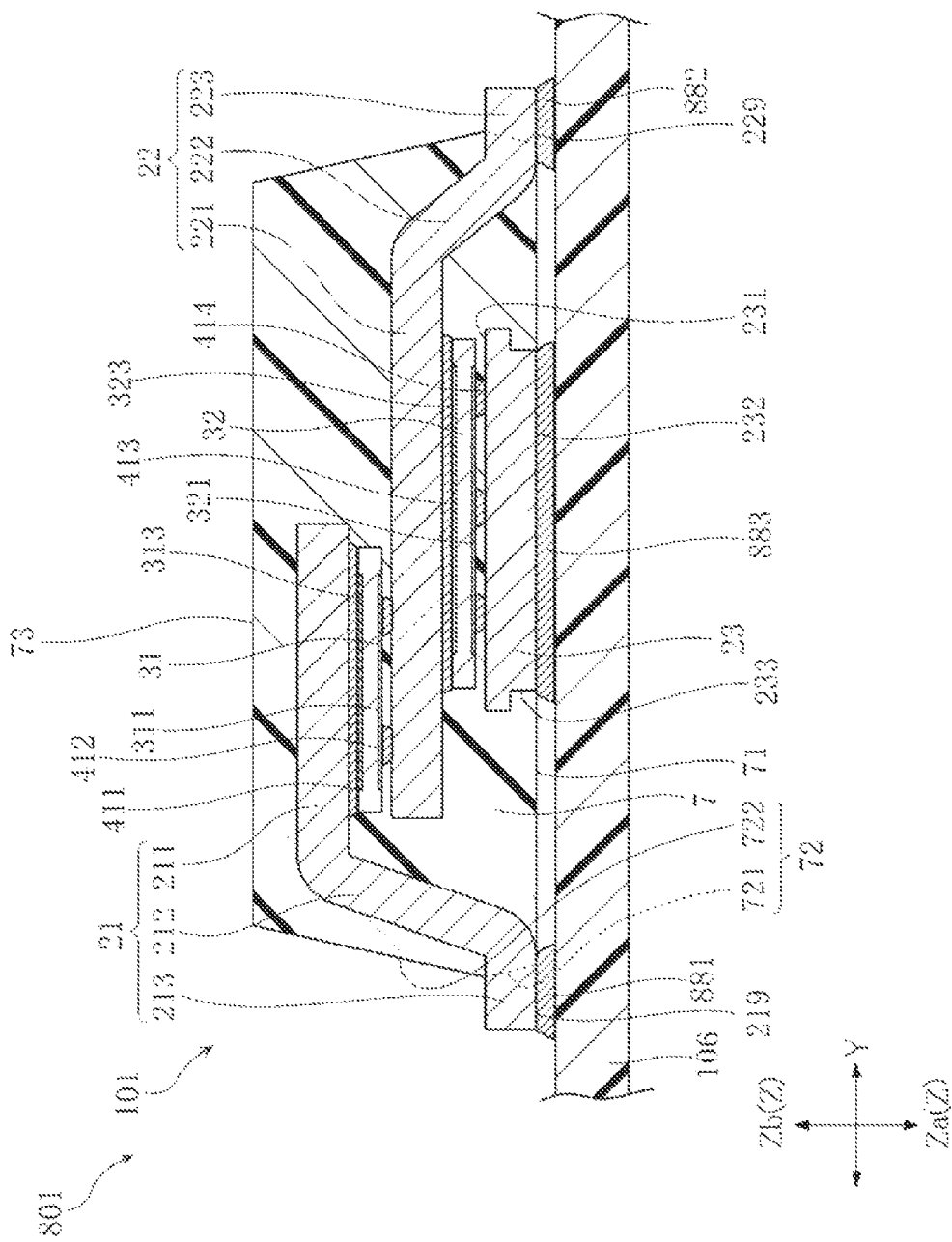
FIG. 3 is a section view taken along like III-III in FIG. 1.

FIG. 1 is a plan view showing a mounting structure according to some embodiments. FIG. 2 is a section view taken along axis II-II in FIG. 1. FIG. 3 is a section view taken along axis III-III in FIG. 1.

A mounting structure 801 shown in FIGS. 1 through 3 includes a semiconductor device 101, a wiring substrate 106 and solder layers 881 to 885.

The wiring substrate 106 may be, for example, a printed circuit board. The wiring substrate 106 includes, for example, an insulating substrate and a patterned electrode (not shown) formed in the insulating substrate. The semiconductor device 101 is mounted on the wiring substrate 106. The solder layers 881 to 885 are interposed between the semiconductor device 101 and the wiring substrate 106. The solder layers 881 to 885 join the semiconductor device 101 and the wiring substrate 106 together.

Figure 4:
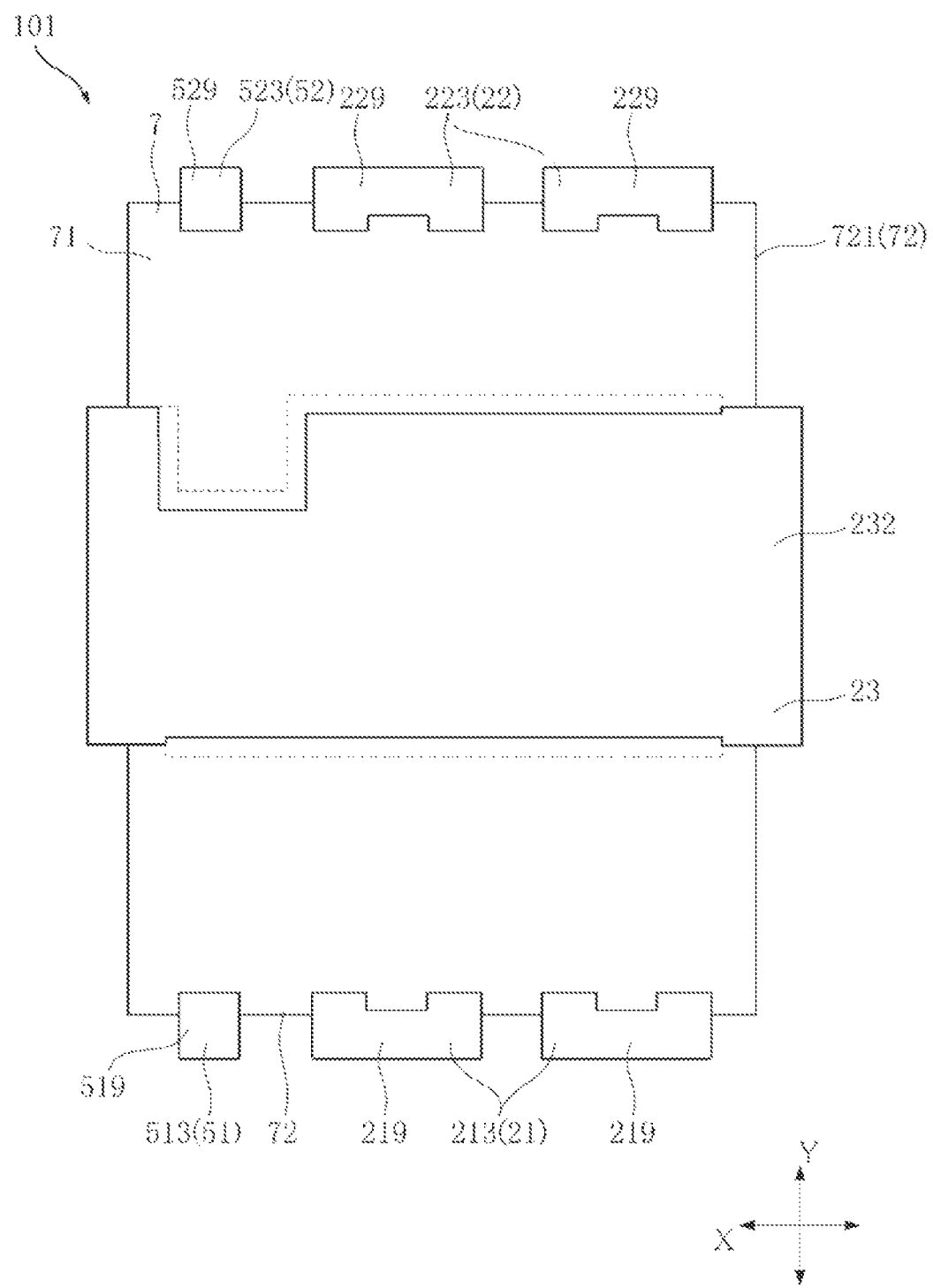
FIG. 4 is a bottom view showing a semiconductor device according to some embodiments.
Figure 5:
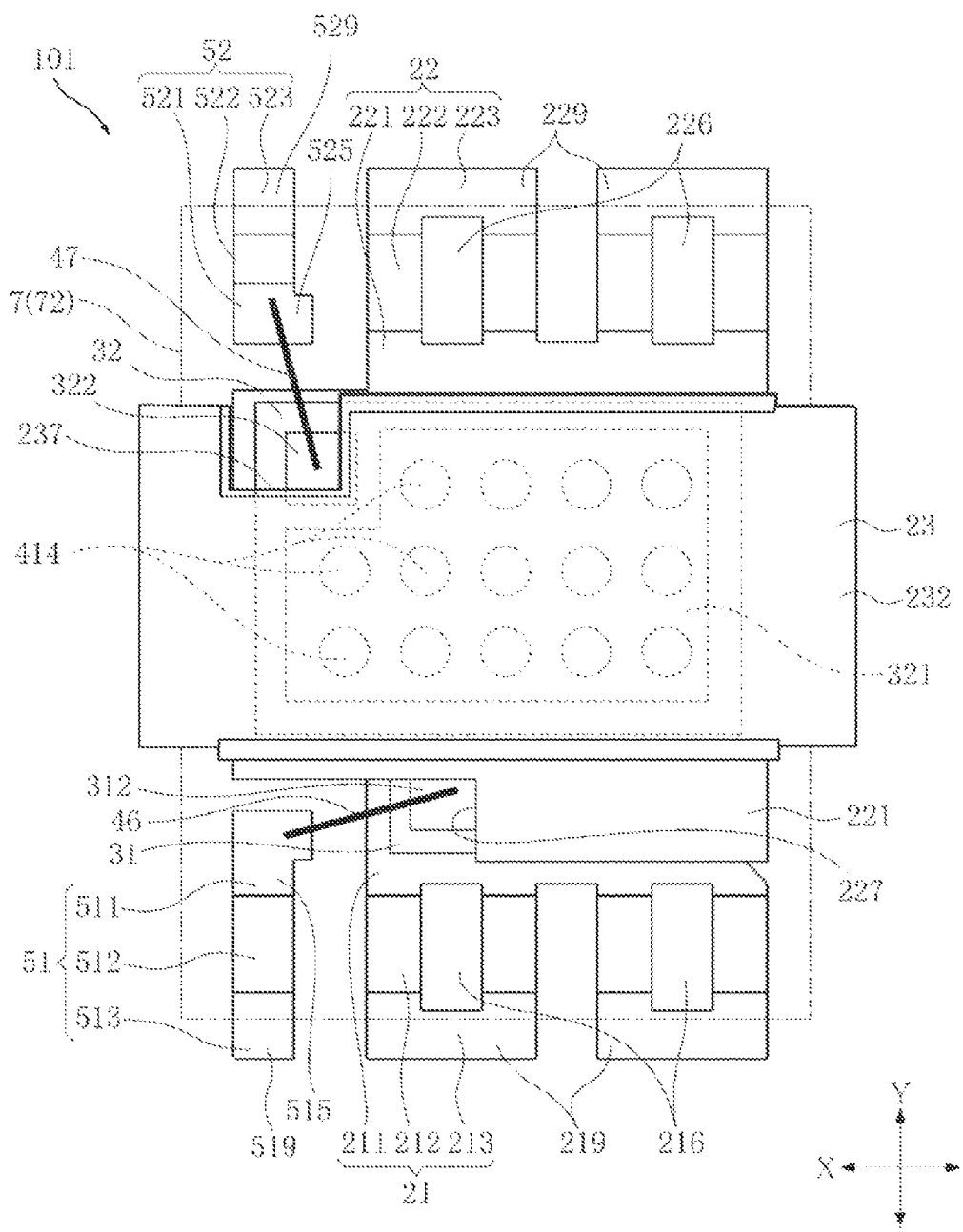
FIG. 5 is a view in ich a resin is omitted from the semiconductor device shown in FIG. 4, according to some embodiments.
Figure 6:
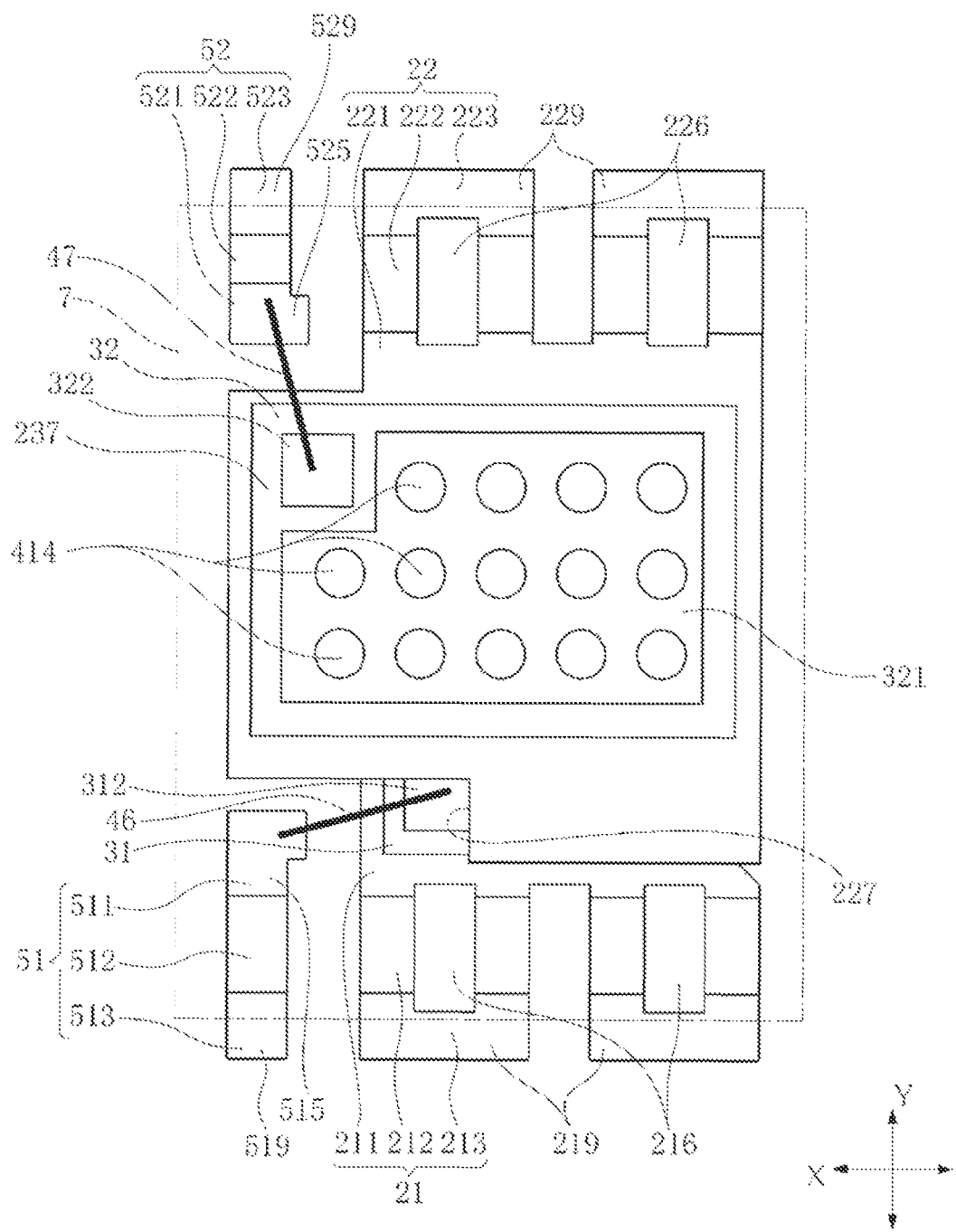
FIG. 6 is a view in which one conductor late is omitted from the semiconductor device shown in FIG. 5, according to some embodiments.
Figure 7:
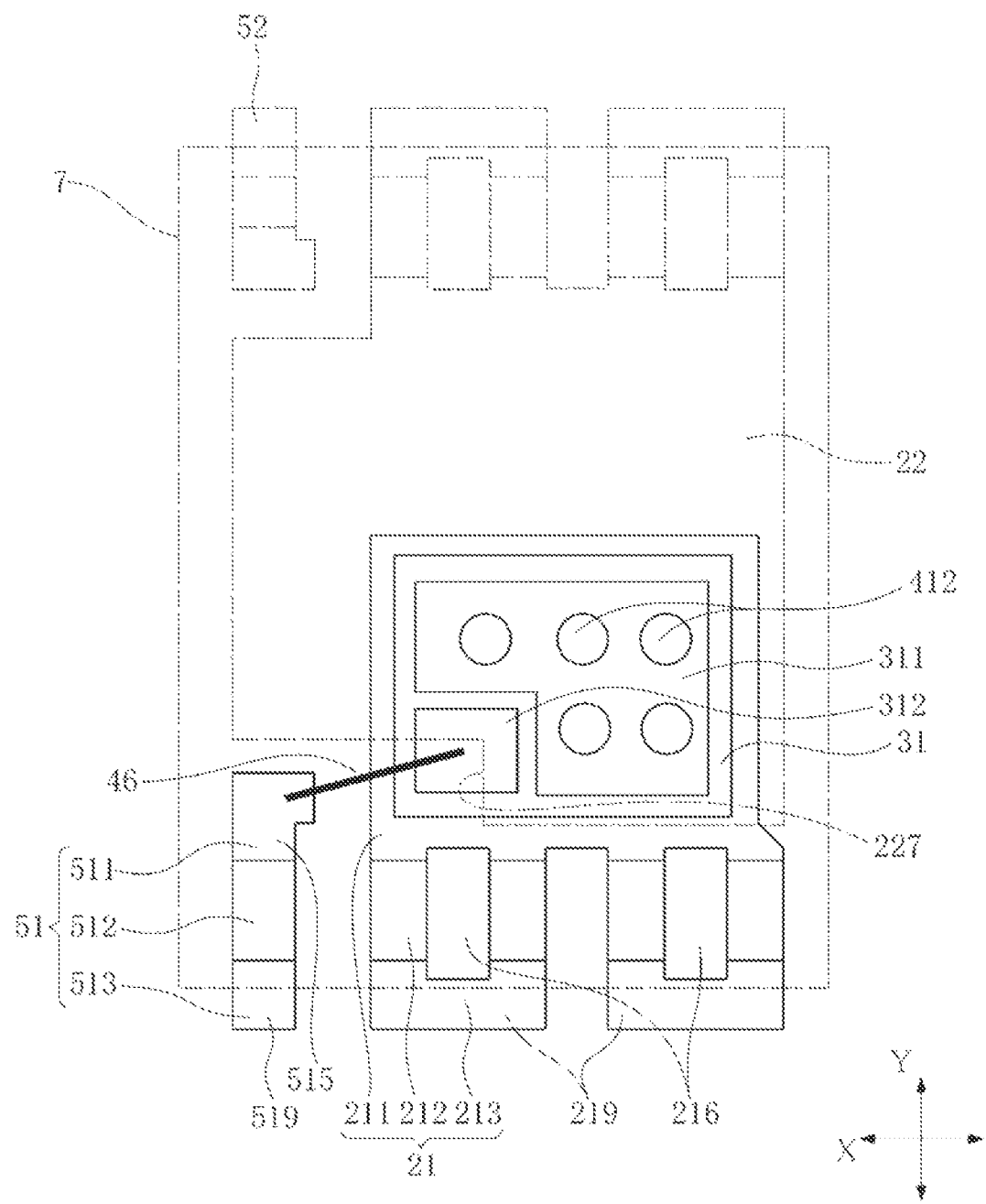
FIG. 7 is a view in which one conductor plate, one semiconductor chip and one wire are omitted from the semiconductor device show ire FIG. 6, according to some embodiments.
Figure 8:
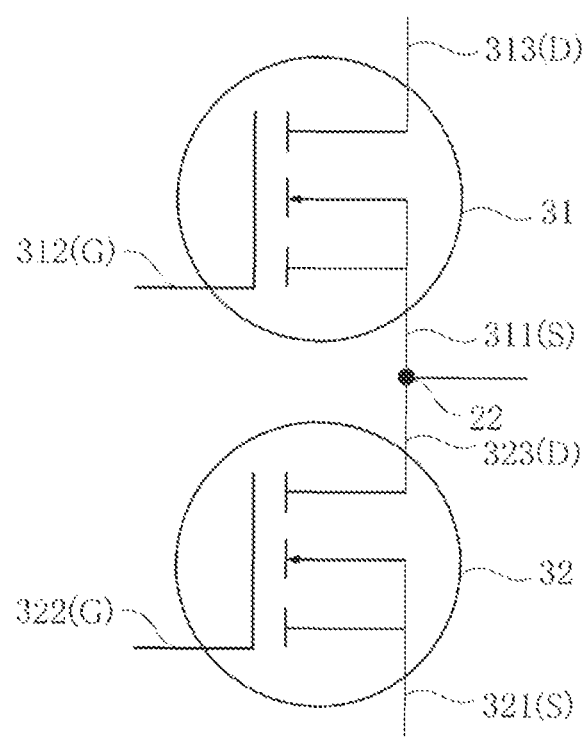
FIG. 8 is circuit diagram showing a circuit made up of the semiconductor device according to some embodiments.

FIG. 4 is a bottom view of the semiconductor device 101. FIG. 5 is a view which a resin 7 is omitted from the semiconductor device 101 shown in FIG. 4. FIG. 6 is a view in which a conductor plate 23 is omitted from the semiconductor device 101 shown in FIG. 5. FIG. 7 is a view in which a conductor plate 22, a semiconductor chip 32 and a wire 47 are omitted from the semiconductor device shown in FIG. 6. FIG. 8 is circuit diagram showing a circuit that includes the semiconductor device 101.

The semiconductor device 101 shown in these figures is, for illustration purposes, a DC/DC converter. The semiconductor device 101 includes conductor plates 21 to 23, semiconductor chips 31 and 32, conductive joint portions 411 to 414, two wires 46 and 47, wire bonding leads 51 and 52, and a resin 7 (indicated by an imaginary line in FIGS. 5 through 7).

The resin 7 shown in FIG. 1 through FIG. 7 covers the conductor plates 21 to 23, the semiconductor chips 31 and 32, the conductive joint portions 411 to 414, the two wires 46 and 47, and the wire bonding leads 51 and 52. The resin 7 is made of, for example, a black epoxy resin. The resin 7 includes a resin bottom surface 71, a resin side surface 72 and a resin major surface 73.

The resin bottom surface 71 has a planar shape extending along the XY-plane and faces toward a Za direction along a Z-axis. The resin side surface 72 shown in FIG. 3 is shaped to surround the semiconductor chips 31 and 32 when seen in the direction along the Z-axis. The resin side surface 72 has a first region 721 and a second region 722. The first region 721 is connected to the resin bottom surface 71. The second region 722 is connected to the first region 721. The second region 722 is inclined with respect to the direction along the Z-axis to make an acute angle with the resin bottom surface 71. The resin major surface 73 has a planar shape extending along the XY-plane and faces toward the Zb direction along the Z-axis. The resin major surface 73 is connected to the second region 722.

The semiconductor chip 31 shown in FIGS. 2, 3 and 7 is an element formed of a semiconductor. The semiconductor chip 31 corresponds to one example of a functional element chip or a first semiconductor chip. Examples of the semiconductor chip 31 include a diode, a transistor or an IC. In some embodiments, as shown in FIG. 8, the semiconductor chip 31 is a high-side transistor of a DC/DC converter. As can be seen in FIG. 7, the semiconductor chip 31 has a rectangular shape when seen in a plan view. The thickness (Z-direction dimension) of the semiconductor chip 31 is, e.g., 200 μm. The X-direction dimension of the semiconductor chip 31 is, 1600 μm. The Y-direction dimension of the semiconductor chip 31 is, e.g., 2200 μm.

As shown in FIGS. 2, 3 and 7, the semiconductor chip 31 includes a major surface electrode 311 (first major surface electrode), a major surface electrode 312 (second major surface electrode) and a rear surface electrode 313 (first rear surface electrode). The major surface electrodes 311 and 312 face in the same direction. In some embodiments, the major surface electrodes 311 and 312 face toward the Za direction in thickness along the Z-axis of the semiconductor chip 31. The rear surface electrode 313 faces in the direction opposite to the direction in which the major surface electrodes 311 and 312 face. In some embodiments, the rear surface electrode 313 faces toward the other Zb direction in thickness along the Z-axis of the semiconductor chip 31.

In some embodiments, the major surface electrode 311 is a source electrode, the major surface electrode 312 may be a gate electrode, and the rear surface electrode 313 may be a drain electrode. In FIG. 8, the source electrode is designated by S, the gate electrode is designated by (3, and the drain electrode is designated by D. This designation of reference numerals are the same as those of circuit diagrams of other embodiments. In some other embodiments, the major surface electrode 311 of the semiconductor chip 31 may be a drain electrode. If the semiconductor chip is an IC, the semiconductor chip may include a lot of major surface electrodes instead of only two major surface electrodes.

The semiconductor chip 32, shown in FIGS. 2, 3 and 6 has substantially the same configuration as the semiconductor chip 31 except that the plan-view size of the semiconductor chip 32 differs from that of the semiconductor chip 31. The semiconductor chip 32 is an element formed of a semiconductor. The semiconductor chip 32 corresponds to one example of a functional element chip or a second semiconductor chip. Examples of the semiconductor chip 32 include a diode, a transistor or IC. In some embodiments, as shown in FIG. 8, the semiconductor chip 32 may be a low-side transistor of a DC/DC converter. As can be seen in FIG. 6, the semiconductor chip 32 has a rectangular shape when seen in a plan view. The thickness (Z-direction dimension) of the semiconductor chip 32, is, e.g., 200 μm. The X-direction dimension of the semiconductor chip 32 is, e.g., 2800 μm. The Y-direction dimension of the semiconductor chip 32 is, e.g., 4000 μm.

As shown in FIGS. 2, 3 and 6, the semiconductor chip 32 includes a major surface electrode 321 (third major surface electrode), a major surface electrode 322 (fourth major surface electrode) and a rear surface electrode 323 (second rear surface electrode). The major surface electrodes 321 and 322 face in the same direction (see FIGS. 2 and 6). In some embodiments, the major surface electrodes 321 and 322 face toward the Za direction. The rear surface electrode 323 faces in the direction opposite to the direction which the major surface electrodes 321 and 322 face. In some embodiments, the rear surface electrode 323 faces toward the Zb direction.

In some embodiments, as shown in FIG. 8, the major surface electrode 321 is a source electrode, the major surface electrode 322 is a gate electrode, and the rear surface electrode 323 is a drain electrode. In other embodiments, the major surface electrode 321 of the semiconductor chip 32 may be a drain electrode. If the semiconductor chip is an IC, the semiconductor chip may include a plurality of major surface electrodes instead of only two major surface electrodes.

The conductor plate 21 shown in FIGS. 1, 2, 3 and 7 is made of a conductor, e.g., Cu. The semiconductor chip 31 is joined to the conductor plate 21 through the conductive joint portion 411 to be set forth later. The conductor plate 21 is formed by bending a single flat plate. The conductor plate 21 includes a pad portion 211, an intermediate portion 212 and a mounting portion 213.

The pad portion 211 has a planar shape extending along the XY-plane. The pad portion 211 is joined to the semiconductor chip 31 through the conductive joint portion 411 and is electrically connected to the semiconductor chip 31. More specifically, the pad portion 211 is joined to the rear surface electrode 313 of the semiconductor chip 31 through the conductive joint portion 411. Thus, the pad portion 211 is electrically connected to the rear surface electrode 313 of the semiconductor chip 31.

The intermediate portion 212 is positioned between the pad portion 211 and the mounting portion 213. The intermediate portion 212 is connected to both the pad portion 211 and the mounting portion 213. The intermediate portion 212 has a plate shape. In some embodiments, the intermediate portion 212 is inclined with respect to the pad portion 211. Moreover, the intermediate portion 212 is inclined with respect to the resin bottom surface 71. The intermediate portion 212 is shaped such that the intermediate portion 212 is configured toward the Za direction as it extends away from the pad portion 211 when seen in the XY-plane. In some embodiments, as shown in FIG. 5, a plurality of holes 216 is formed in the intermediate portion 212. The respective holes 216 are filled with a portion of the resin 7. Forming the holes 216 allows for strongly engaging the resin 7 and the intermediate portion 212 (the conductor plate 21) together. If the resin 7 and the intermediate portion 212 (the conductor plate 21) are strongly joined together, they are difficult to separate from each other. Thus, this allows for an increase in moisture resistance.

The mounting portion 213 has a region exposed from the resin 7. More specifically, the mounting portion 213 is exposed from the first region 721 of the resin side surface 72 and the resin bottom surface 71. As shown in FIGS. 1 and 3, the mounting portion 213 protrudes from the first region 721 toward one side in the Y direct on, hi other embodiments, the mounting portion 213 may not protrude from the first region 721 but may have aside surface flush with the resin side surface 72. As shown in FIGS. 3 through 5, the mounting portion 213 has a mounting surface 219. The mounting surface 219 is exposed from the resin bottom surface 71 and is flush with the resin bottom surface 71. As can be seen in FIG. 3, the mounting surface 219 is joined to the wiring substrate 106 through the solder layer 881. The conductor plate 21 is electrically connected to the wiring layer of the wiring substrate 106 via the solder layer 881. As stated above, the conductor plate 21 is formed by bending a single flat plate. Thus, the thickness (Z-direction dimension) of the mounting portion 213 is equal to the thickness (Z-direction dimension) of the pad portion 211.

The conductor plate 22 shown in FIGS. 1, 2, 3 and 6 has substantially the same configuration as the conductor plate 21. The conductor plate 22 is made of a conductor, e.g., Cu. The conductor plate 22 corresponds to one example of an electric connection member or a first conductor plate. The semiconductor chip 32 is joined to the conductor plate 22 through the conductive joint portion 413 to be set forth later. The conductor plate 22 is formed by bending a single flat plate. The conductor plate 22 includes a pad portion 221, an intermediate portion 772 and a mounting portion 223.

The pad portion 221 has a planar shape extending along the XY-plane. As shown in FIG. 3 or 6, the pad portion 221 overlaps with the pad portion 211 when seen in the XY-plane. The semiconductor chip 31 is positioned between the pad portion 221 and the pad portion 211. The pad portion 221 is joined to the semiconductor chip 31 through the conductive joint portion 412 and is electrically connected to the semiconductor chip 31. More specifically, the pad portion 221 is joined to the major surface electrode 311 of the semiconductor chip 31 through the conductive joint portion 412. Thus, the pad portion 221 is electrically connected to the major surface electrode 311 of the semiconductor chip 31. On the other hand, the pad portion 221 is positioned between the semiconductor chip 31 and the semiconductor chip 32. The pad portion 221 is joined to the semiconductor chip 32 through the conductive joint portion 413 and is electrically connected to the semiconductor chip 32. More specifically, the pad portion 221 is joined to the rear surface electrode 323 of the semiconductor chip 32 through the conductive joint portion 413. Thus, the pad portion 221 is electrically connected to the rear surface electrode 323 of the semiconductor chip 32. As shown in FIG. 6, a recess portion 227 is formed in the pad portion 221. The recess portion 227 is recessed from the outside to the inside of the pad portion 221 when seen in the XY-plane. The recess portion 227 overlaps with the major surface electrode 312 when seen in the XY-plane.

The intermediate portion 222 is positioned between the pad portion 221 and the mounting portion 223. The intermediate portion 222 is connected to both the pad portion 221 and the mounting portion 223. The intermediate portion 222 has a plate shape. In some embodiments, the intermediate portion 222 is inclined with respect to the pad portion 221. Moreover, the intermediate portion 222 is inclined with respect to the resin bottom surface 71. The intermediate portion 222 is shaped such that the intermediate portion 222 goes toward the Za direction as it extends away from the pad portion 221 when seen in the XY-plane. In some embodiments, as shown in FIG. 5, a plurality of holes 226 is formed in the intermediate portion 222. The respective holes 226 are filled with a portion of the resin 7. Forming the holes 226 allows for strongly engaging the resin 7 and the intermediate portion 222 (the conductor plate 22) together. If the resin 7 and the intermediate portion 222 (the conductor plate 22) are strongly joined together, they are difficult to separate from each other. Thus, moisture resistance may be increased.

The mounting portion 223 has a region exposed from the resin 7. More specifically, the mounting portion 223 is exposed from the first region 721 of the resin side surface 72 and the resin bottom surface 71. As shown in FIGS. 1 and 3, the mounting portion 223 protrudes from the first region 721 toward one side in the Y direct on. In other embodiments, the mounting portion 223 may not protrude from the first region 721 but may have a side surface flush with the resin side surface 72. The mounting portion 223 has a mounting surface 229. The mounting surface 229 is exposed from the resin bottom surface 71 and is flush with the resin bottom surface 71. The mounting surface 229 is joined to the wiring substrate 106 through the solder layer 882. The conductor plate 22 is electrically connected to the wiring layer of the wiring substrate 106 via the solder layer 882. As stated above, the conductor plate 22 is formed by bending a single flat plate. Thus, the thickness (Z-direction dimension) of the mounting portion 223 is equal to the thickness (Z-direction dimension) of the pad portion 221.

The conductor plate 23 shown in FIGS. 1 through 5 is made of a conductor, e.g., Cu. The conductor plate 23 corresponds to one example of a second conductor plate. The semiconductor chip 32 is joined to the conductor plate 23 through the conductive joint portion 414 to be set forth later. The conductor plate 23 has a planar shape extending along the XY-plane. The conductor plate 23 overlaps with the pad portion 221 when seen in the XY-plane. The semiconductor chip 32 is positioned between the conductor plate 23 and the pad portion 221. The conductor plate 23 is joined to the semiconductor chip 32 through the conductive joint portions 414 and is electrically connected to the semiconductor chip 32. As shown in FIGS. 2 through 4, the conductor plate 23 has a region exposed from the resin 7. More specifically, the conductor plate 23 is exposed from the first region 721 of the resin side surface 72 and the resin bottom surface 71. As shown in FIGS. 1 and 4, the conductor plate 23 protrudes from the first region 721 in the X direction. In other embodiments, the conductor plate 23 may not protrude from the first region 721 but may have a side surface flush with the resin side surface 72.

As shown in FIGS. 2 and 3, the conductor plate 23 has a conductor surface 231 (first conductor surface) and a conductor surface 232 (second conductor surface). The conductor surfaces 231 and 232 have a planar shape extending along the XY-plane. The conductor surface 231 faces toward the Zb direction and the conductor surface 232 faces toward the Za direction. In other words, the conductor surfaces 231 and 232 face in the opposite direction from each other. The conductor surface 231 is joined to the major surface electrode 321 of the semiconductor chip 32 through the conductive joint portion 414. Thus, the conductor plate 23 is electrically connected to the major surface electrode 321 of the semiconductor chip 32. On the other hand, the conductor surface 232 is exposed from the resin bottom surface 71. The conductor surface 232 is flush with the resin bottom surface 71. The conductor surface 232 is joined to the wiring substrate 106 through the solder layer 883. The conductor surface 232 is electrically connected to the wiring layer of the wiring substrate 106 via the solder layers 883. As shown in FIG. 5, a recess portion 237 is formed in the conductor plate 23. The recess portion 237 is recessed from the outside to the inside of the conductor plate 23 when seen in the XY-plane. The recess portion 237 overlaps with the major surface electrode 322 when seen in the XY-plane.

As shown in FIG. 3, the conductor plate 23 includes a step portion 233 recessed from the conductor surface 232 toward the conductor surface 231 at the Y-direction end. Thus, the conductor surface 231 has a portion protruding beyond the conductor surface 232 in the Z direction when seen in the Y direction. Thus, the conductor plate 23 may be prevented from falling down from the resin 7.

Each of the conductive joint portions 411 to 414 shown in FIGS. 2, 3, 5, 6 and 7 is made of a conductor. Examples of the conductor making up each of the conductive joint portions 411 to 414 include solder and silver. In some embodiments, the conductor making up the conductive joint portions 411 and 413 is silver and the conductor making up the conductive joint portions 412 and 414 is solder.

The conductive joint portion 411 is interposed between the rear surface electrode 313 of the semiconductor chip 31 and the pad portion 211 of the conductor plate 21. The conductive joint portion 411 is used to join the semiconductor chip 31 and the conductor plate 21 together. Thus, the rear surface electrode 313 of the semiconductor chip 31 and the conductor plate 21 are electrically connected to each other.

Similarly the conductive joint portions 412 are interposed between the major surface electrode 311 of the semiconductor chip 31 and the pad portion 221 of the conductor plate 22 (five conductive joint portions 412 are shown in FIG. 7). The conductive joint portions 112 are used to join the semiconductor chip 31 and the conductor plate 22 together. Thus, the major surface electrode 311 of the semiconductor chip 31 and the conductor plate 22 are electrically connected to each other.

Likewise, the conductive joint portion 413 is interposed between the rear surface electrode 323 of the semiconductor chip 32 and the pad portion 221 of the conductor plate 22. The conductive joint portion 413 is used to join the semiconductor chip 32 and the conductor plate 22 together. Thus, the rear surface electrode 323 of the semiconductor chip 32 and the conductor plate 22 are electrically connected to each other. Accordingly, as shown in FIG. 8, the rear surface electrode 323 of the semiconductor chip 32 (the drain electrode of the low-side element in some embodiments) and the major surface electrode 311 of the semiconductor chip 31 (the source electrode of the high-side element in some embodiments) are electrically connected to each other via the conductive joint portions 412 and 413 and the conductor plate 22. The conductive joint portions 412 and 113 are not shown in FIG. 8.

In a like manner, the conductive joint portions 414 are interposed between the major surface electrode 321 of the semiconductor chip 32 and the conductor surface 231 of the conductor plate 23 (fourteen conductive joint portions 411 are shown in FIGS. 5 and 6). The conductive joint portions 414 are used to join the semiconductor chip 32 and the conductor plate 23 together. Thus, the major surface electrode 321 of the semiconductor chip 32 and the conductor plate 23 are electrically connected to each other.

The wire bonding lead 51 shown in FIGS. 1, 2, 5, 6 and 7 is made of a conductor, e.g., Cu. The wire bonding lead 51 is formed by bending a single flat plate. In some embodiments, the wire bonding lead 51 and the conductor plate 21 are simultaneously formed by bending a single flat plate. The wire bonding lead 51 includes a pad portion 511, an intermediate portion 512 and a mounting portion 513.

The pad portion 511 has a pad major surface 515 and a pad rear surface 516. The pad major surface 515 faces toward the side at which the resin bottom surface 71 is positioned (toward the Za direction). As shown in FIG. 2, the pad major surface 515 is positioned at the side closer to the major surface electrode 311 than the rear surface electrode 313 (toward the Za direction) along the Z axis. On the other hand, the pad rear surface 516 faces in the direction opposite to the direction in which the pad major surface 515 faces.

The intermediate portion 512 is positioned between the pad portion 511 and the mounting portion 513. The intermediate portion 512 is connected to both the pad portion 511 and the mounting portion 513. In some embodiments, the intermediate portion 512 is inclined with respect to the pad portion 511. Moreover, the intermediate portion 512 is inclined with respect to the resin bottom surface 71. The intermediate portion 512 is shaped such that the intermediate portion 512 goes toward the Za direction as it extends away from the pad portion 511 when seen in the XY-plane.

The mounting portion 513 has a region exposed from the resin 7. More specifically, the mounting portion 513 is exposed from the first region 721 of the resin side surface 72 and the resin bottom surface 71. The mounting portion 513 protrudes from the first region 721 toward one side in the Y direct on. As shown in FIGS. 1 and 2, the mounting portion 513 protrudes from the first region 721 in the same direction as the mounting portion 213. ID other embodiments, the mounting portion 513 may not protrude from the first region 721 but may have a side surface flush with the resin side surface 72. The mounting portion 513 has a mounting surface 519. The mounting surface 519 is exposed from the resin bottom surface 71 and is flush with the resin bottom surface 71. The mounting surface 519 is joined to the wiring substrate 106 through the solder layer 884. The wire bonding lead 51 is electrically connected to the wiring layer of the wiring substrate 106 via the solder layer 884. As set forth above, the wire bonding lead 51 is formed by bending a single flat plate. The thickness (Z-direction dimension) of the mounting portion 513 is equal to the thickness (Z-direction dimension) of the pad portion 511. In some embodiments, the wire bonding lead 51 and the conductor plate 21 are simultaneously formed by bending a single flat plate. Therefore, the thickness (Z-direction dimension) of the mounting portion 513 is equal to the thickness of the mounting portion 213 of the conductor plate 21. In some embodiments, the pad portion 511, the mounting portion 513, the pad portion 211 and the mounting portion 213 have equal thickness.

The wire bonding lead 52 shown in FIGS. 1, 2, 5, 6 and 7 has substantially the same configuration as the wire bonding lead 51. The wire bonding lead 52 is made of a conductor, e.g., Cu. The wire bonding lead 52 is formed by bending a single flat plate. In some embodiments, the wire bonding lead 52 and the conductor plate 22 are simultaneously formed by bending a single flat plate. The wire bonding lead 52 includes a pad portion 521, an intermediate portion 522 and a mounting portion 523.

The pad portion 521 has a pad major surface 525 and a pad rear surface 526. The pad major surface 525 faces toward the side at which the resin bottom surface 71 is positioned (toward the Za direction). As shown in FIG. 2, the pad major surface 525 is positioned at the side closer to the major surface electrode 321 than the rear surface electrode 323 (toward the Za direction) along the Z-axis. On the other hand, the pad rear surface 526 faces in the direction opposite to the direction in which the pad major surface 525 faces.

The intermediate portion 522 is positioned between the pad portion 521 and the mounting portion 523. The intermediate portion 522 is connected to both the pad portion 521 and the mounting portion 523. In some embodiments, the intermediate portion 522 is inclined with respect to the pad portion 521. Moreover, the intermediate portion 522 is inclined with respect to the resin bottom surface 71. The intermediate portion 522 is shaped such that the intermediate portion 522 is configured towards the Za direction as it extends away from the pad portion 521 when seen in the XY-plane.

The mounting portion 523 has a region exposed from the resin 7. More specifically, the mounting portion 523 is exposed from the first region 721 of the resin side surface 72 and the resin bottom surface 71. As shown in FIG. 2, the mounting portion 523 protrudes from the first region 721 toward one side in the Y direction. The mounting portion 523 protrudes from the first region 721 in the same direction as the mounting portion 223 does. In other embodiments, the mounting portion 523 may not protrude from the first region 721 but may have a side surface flush with the resin side surface 72. The mounting portion 523 has a mounting surface 529. The mounting surface 529 is exposed from the resin bottom surface 71 and is flush with the resin bottom surface 71. The mounting surface 529 is joined to the wiring substrate 106 through the solder layer 885. The wire bonding lead 52 is electrically connected to the wiring layer of the wiring substrate 106 via the solder layer 885. As set forth above, the wire bonding lead 52 is formed by bending a single flat plate. Therefore, the thickness (Z-direction dimension) of the mounting portion 523 is equal to the thickness (Z-direction dimension) of the pad portion 521. Further, in some embodiments, the wire bonding lead 52 and the conductor plate 22 are simultaneously formed by bending a single flat plate. Accordingly, the thickness (Z-direction dimension) of the mounting portion 523 is equal to the thickness of the mounting portion 223 of the conductor plate 22. In some embodiments, the pad portion 521, the mounting portion 523, the pad portion 221 and the mounting portion 223 are equal in thickness to one another.

Each of the wires 46 and 47 is made of a conductor, e.g., Au or Cu. The wire 46 is a first wire and is joined to the major surface electrode 312 of the semiconductor chip 31 and the pad major surface 515 of the pad portion 511. Thus, the major surface electrode 312 of the semiconductor chip 31 is electrically connected to the wire bonding lead 51 via the wire 46. As shown in FIG. 2, the wire 46 has a portion overlapping with the conductor plate 22 in the Z direction. In some embodiments, as shown in FIG. 5, a portion of the wire 46 is arranged in the recess portion 227 of the conductor plate 22. In this manner, the wire 46 is arranged in a different position from the position of the conductor plate 22 when seen in the Z direction.

The wire 47 is a second wire and is joined to the major surface electrode 322 of the semiconductor chip 32 and the pad major surface 525 of the pad portion 521. Thus, the major surface electrode 322 of the semiconductor chip 32 is electrically connected to the wire bonding lead 52 via the wire 47. As shown in FIG. 2, the wire 47 has a portion overlapping with the conductor plate 23 in the Z direction. In some embodiments, as shown in FIG. 5, a portion of the wire 47 is arranged in the recess portion 237 of the conductor plate 23. In this manner, the wire 47 is arranged in a different position from the position of the conductor plate 23 when seen in the Z direction.

Next, one example of a method for manufacturing the semiconductor device 101 is described briefly.

In manufacturing the semiconductor device 101, a first intermediate product 851 (see FIGS. 9 and 10), a second intermediate product 852 (see FIGS. 11 and 12) and a lead frame 843 (see FIGS. 13 and 14) are produced.

Figure 9:
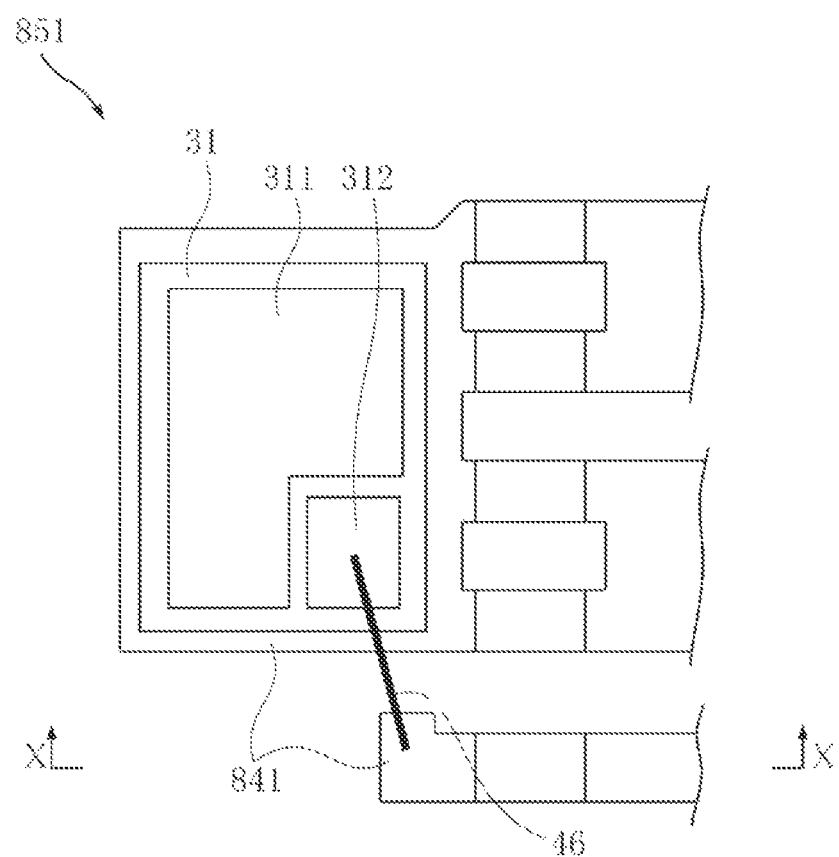
FIG. 9 is a plan view illustrating one step of a semiconductor device manufacturing method according to some embodiments.
Figure 10:
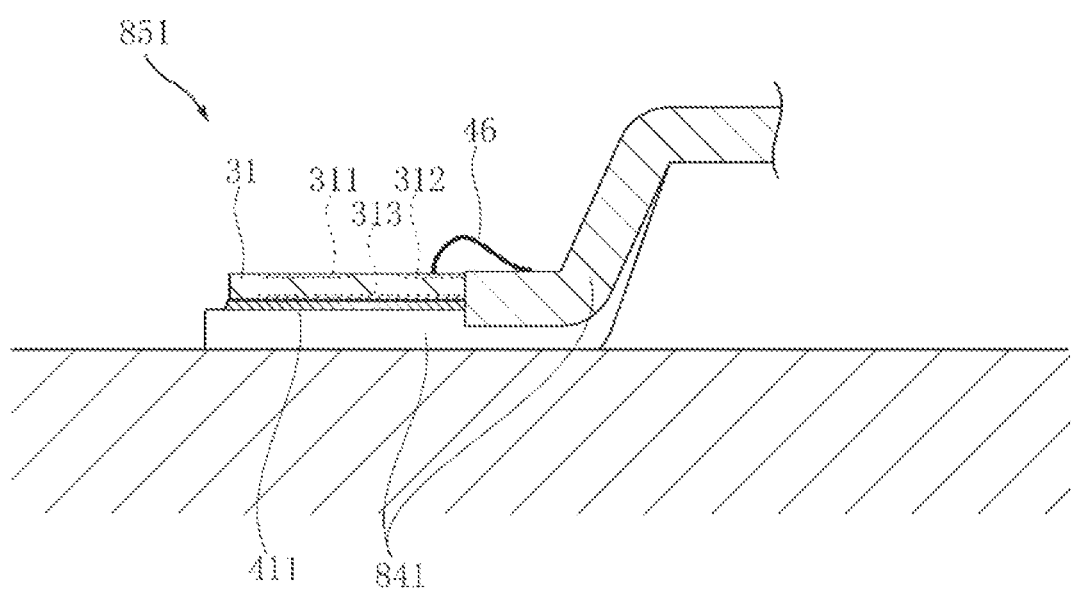
FIG. 10 is a section view taken along line X-X in FIG. 9.

In order to produce the first intermediate product 851, a lead frame 841 shown in FIGS. 9 and 10 is first formed from a single conductor plate. The lead frame 841 becomes the conductor plate 21 and the wire bonding lead 51 later in the manufacturing process. Then, the rear surface electrode 313 of the semiconductor chip 31 is joined to the lead frame 841 through the conductive joint portion 411. Subsequently, the wire 46 is bonded to the major surface electrode 312 of the semiconductor chip 31 and the lead frame 841. Thus, the first intermediate product 851 shown in FIGS. 9 and 10 is manufactured. The step of bonding the wire 46 is performed in a state that the major surface electrode 312 faces upwards in the gravitational direction.

Figure 11:
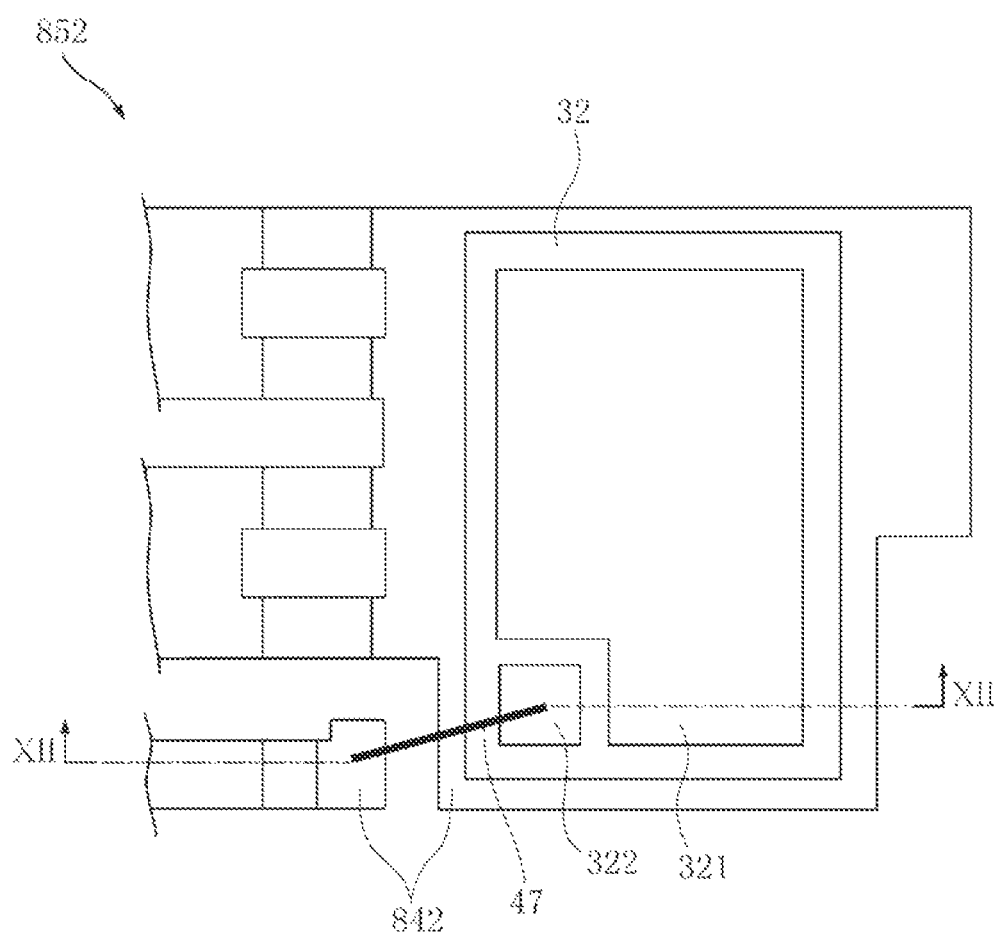
FIG. 11 is a plan view illustrating one step of the semiconductor device manufacturing method according to some embodiments.
Figure 12:
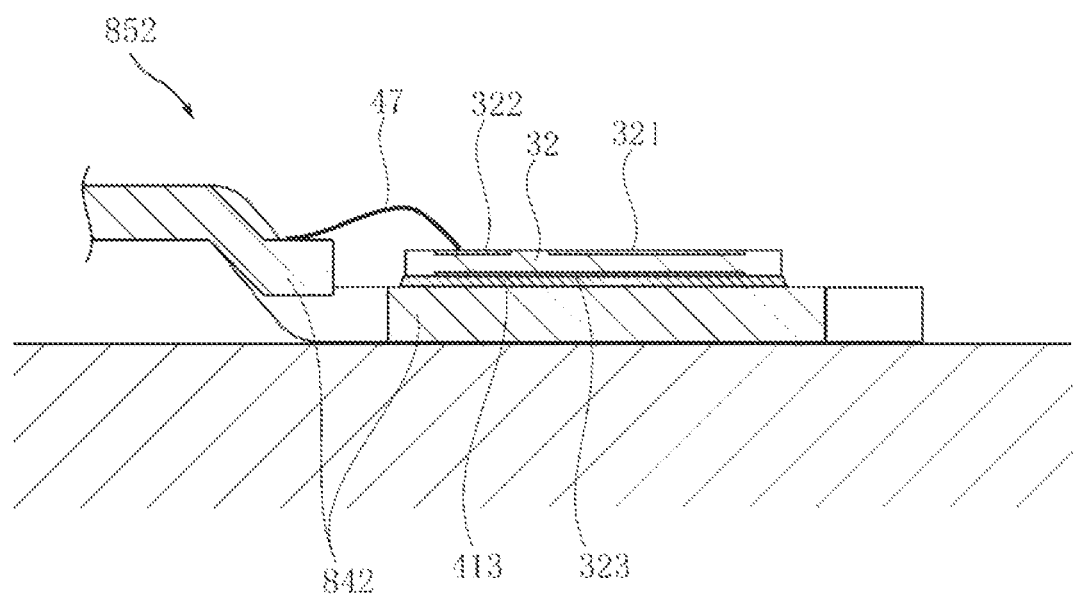
FIG. 12 is a section view taken along line in FIG. H.

Similarly, for the manufacture of the second intermediate product 852, a lead frame 842 shown in FIGS. 11 and 12 is formed from a single conductor plate. The lead frame 842 becomes the conductor plate 22 and the wire bonding lead 52 later in the manufacturing process. Then, the rear surface electrode 323 of the semiconductor chip 32 is joined to the lead frame 842 through the conductive joint portion 413. Subsequently, the wire 47 is bonded to the major surface electrode 322, of the semiconductor chip 32, and the lead frame 842. Thus, the second intermediate product 852 shown in FIGS. 11 and 12 is manufactured. The step of bonding the wire 47 is performed in a state that the major surface electrode 322 faces upwards in the gravitational direction.

Figure 13:
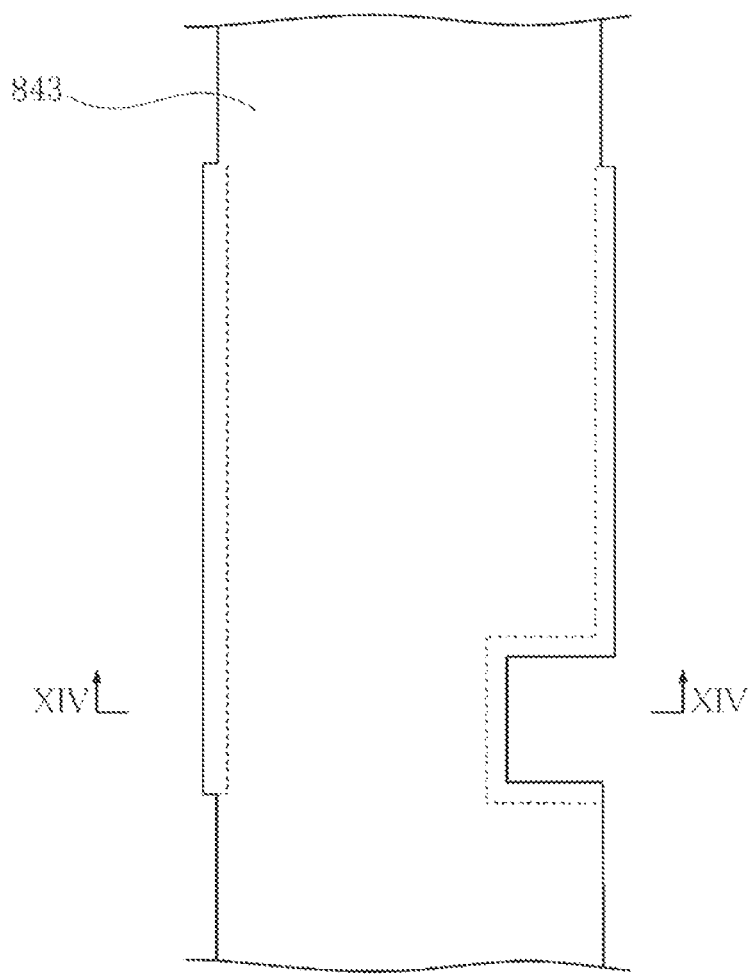
FIG. 13 is a plan view illustrating one step of the semiconductor device manufacturing method according to some embodiments.
Figure 14:
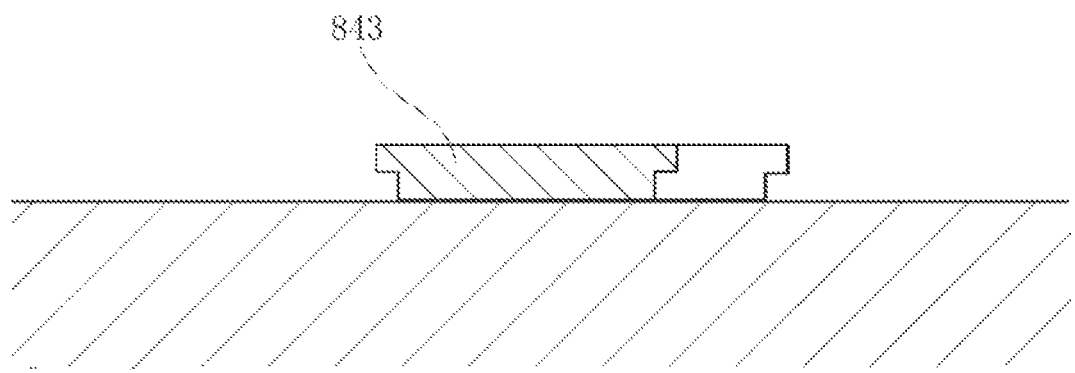
FIG. 14 is a section view taken along line XIV-XIV in FIG. 13.

The lead frame 843 shown in FIGS. 13 and 14 is formed from a single conductor plate. The lead frame 843 becomes the conductor plate 23 later in the manufacturing process.

Figure 15:
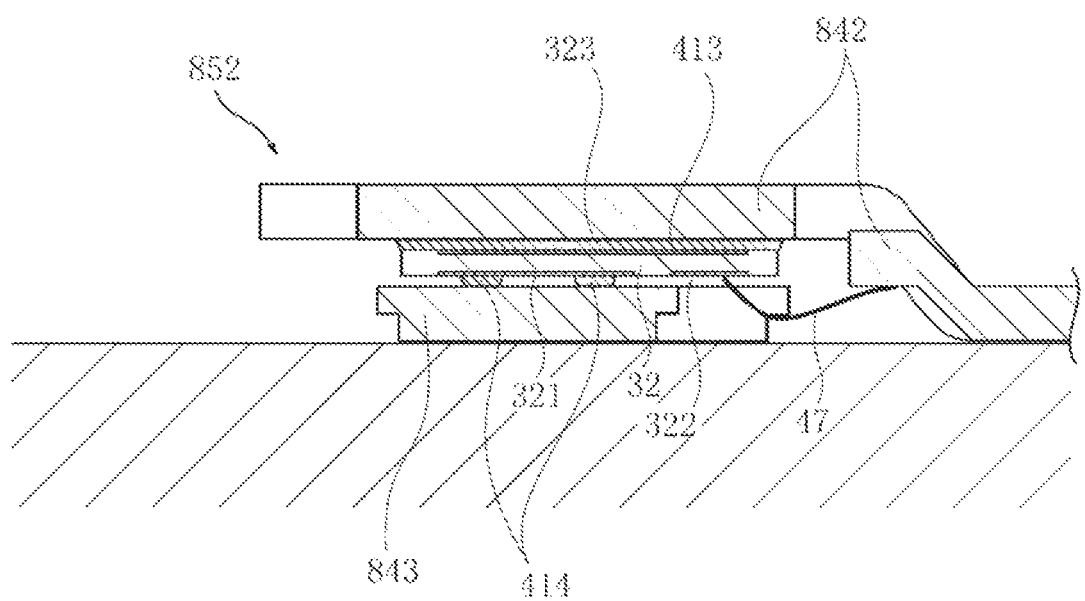
FIG. 15 is a section view illustrating one step of the semiconductor device manufacturing method according to some embodiments.

Next, as shown in FIG. 15, the second intermediate product 852 is joined to the lead frame 843. In some embodiments, during the step of joining the lead frame 843 and the second intermediate product 852 together, the second intermediate product 852 is turned over from the state shown in FIG. 12. Then, the major surface electrode 321 of the semiconductor chip 32 and the lead frame 843 are joined through the conductive joint portion 414.

Figure 16:
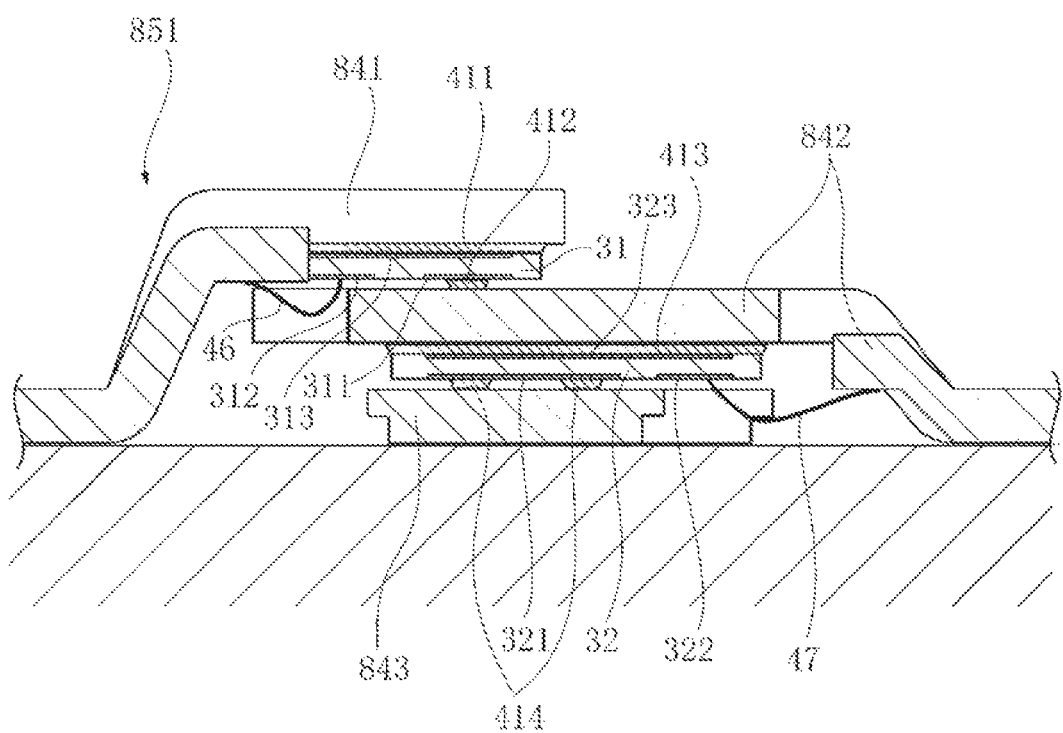
FIG. 16 is a section view illustrating one step of the semiconductor device manufacturing method according to some embodiments.

Next, as shown in FIG. 16, the first intermediate product 851 is joined to the lead frame 842. In some embodiments, during the step of joining the lead frame 842 and the first intermediate product 851 together, the first intermediate product 851 is turned over from the state shown in FIG. 10. Then, the major surface electrode 311 of the semiconductor chip 31 and the lead frame 842 are joined through the conductive joint portion 412.

Figure 17:
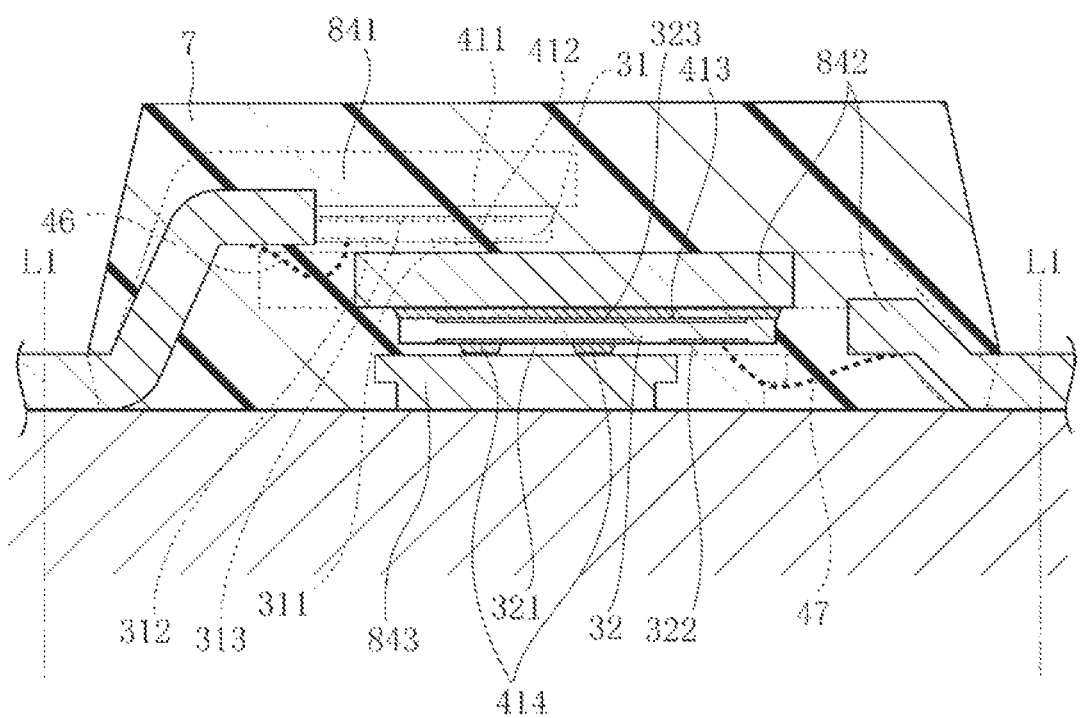
FIG. 17 is a section view illustrating one step of the semiconductor vice manufacturing method according to some embodiments.

Next, as shown in FIG. 17, the resin 7 is formed. Then, the lead frames 841, 842 and 843 are cut along the lines L1 in FIG. 17 (partially not shown), thereby manufacturing the semiconductor device 101 shown in FIG. 2 and other figures.

In the semiconductor device 101, as shown in FIG. 2, the major surface electrode 311 of the semiconductor chip 31 and the semiconductor chip 32 are all joined to the conductor plate 22. With this configuration, the semiconductor chips 31 and 32 are electrically connected to each other via the conductor plate 22. This eliminates the need to electrically interconnect the semiconductor chips 31 and 32 via wiring lines arranged outside the semiconductor device 101. If the need to use the wiring lines arranged outside the semiconductor device 101 is eliminated, the wiring resistance and wiring inductance of a route for the electric connection of the semiconductor chips 31 and 32 mainly becomes the resistance and inductance of the conductor plate 22. This assists in reducing the wiring resistance and wiring inductance of the circuit made up of the semiconductor device 101. Accordingly, the semiconductor device 101 may reduce power consumption and enhance performance.

In the semiconductor device 101, as shown in FIG. 2, the wire 46 bonded to the major surface electrode 312 has a portion overlapping, in the Z direction, with the conductor plate 22 joined to the major surface electrode 311. With this configuration, the wire 46 and the conductor plate 22 may be prevented from making contact with each other. Accordingly, there is no need to arrange the conductor plate 22 in a position spaced apart in the Z direction from the major surface electrode 311, in order to prevent the contact of the wire 46 and the conductor plate 22. This eliminates the need to provide a useless space between the conductor plate 22 and the major surface electrode 311. As a result, the thickness of the semiconductor device 101 may be reduced. Similarly, in the semiconductor device 101, the wire 47 bonded to the major surface electrode 322 has a portion overlapping, in the Z direction, with the conductor plate 23 joined to the major surface electrode 321. With this configuration, for the same reasons noted above, the size of the semiconductor device 101 may be reduced.

In the semiconductor device 101, as shown in FIG. 2, the pad major surface 515 is positioned at the side closer to the major surface electrode 311 than the rear surface electrode 313 (at the Za direction) along the Z-axis. As the pad major surface 515 is positioned further toward the Za direction, it becomes harder for the wire 46 bonded to the pad major surface 515 to make contact with the semiconductor chip 31. Accordingly, this configuration enables the wire 46 to be prevented from making contact with the semiconductor chip 31. Similarly, in the semiconductor device 101, the pad major surface 525 is positioned at the side closer to the major surface electrode 321 than the rear surface electrode 323 (toward the Za direction) along the Z axis. This configuration helps prevent the wire 47 from making contact with the semiconductor chip 32.

In the semiconductor device 101, the wire bonding lead 51 includes the intermediate portion 512 positioned between the pad portion 511 and the mounting portion 513. The intermediate portion 512 is inclined with respect to the resin bottom surface 71. With this configuration, the capillary (not shown) used in bonding the wire 46 to the pad portion 511 may be prevented from making contact with the intermediate portion 512. Similarly, in the semiconductor device 101, the wire bonding lead 52 includes the intermediate portion 522 positioned between the pad portion 521 and the mounting portion 523. The intermediate portion 522 is inclined with respect to the resin bottom surface 71. With this configuration, the capillary (not shown) used in bonding the wire 47 to the pad portion 521 may be prevented from making contact with the intermediate portion 522.

Other embodiments are now described with reference to FIGS. 18 through 44. In the following embodiments, identical or similar components to those described with respect to previous embodiments will be designated by like reference symbols, and will not be described in detail.

Second Embodiment

Additional embodiments are described with reference to FIGS. 18 through 34.

Figure 18:
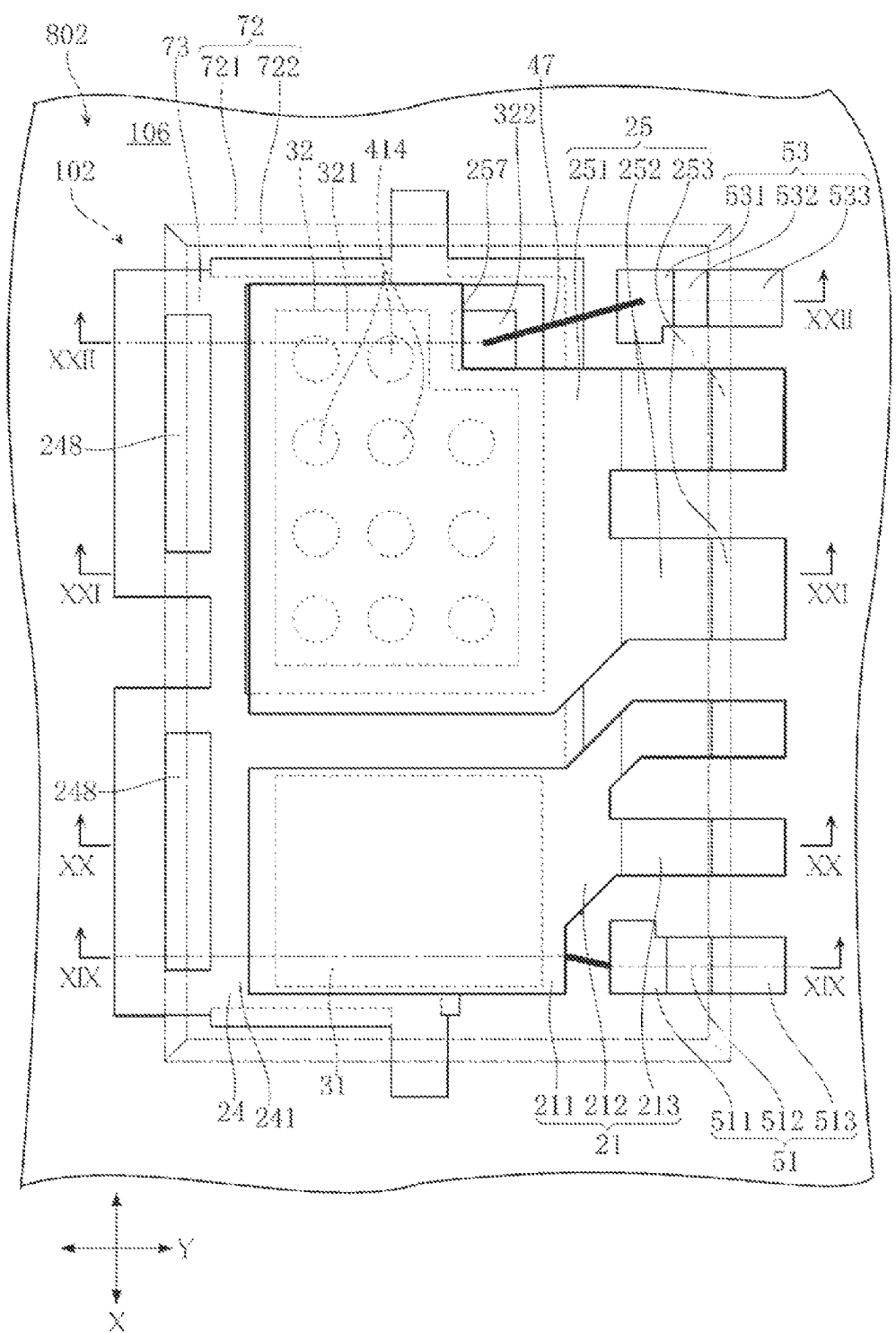
FIG. 18 is a plan view showing a mounting structure according to some embodiments.
Figure 19:
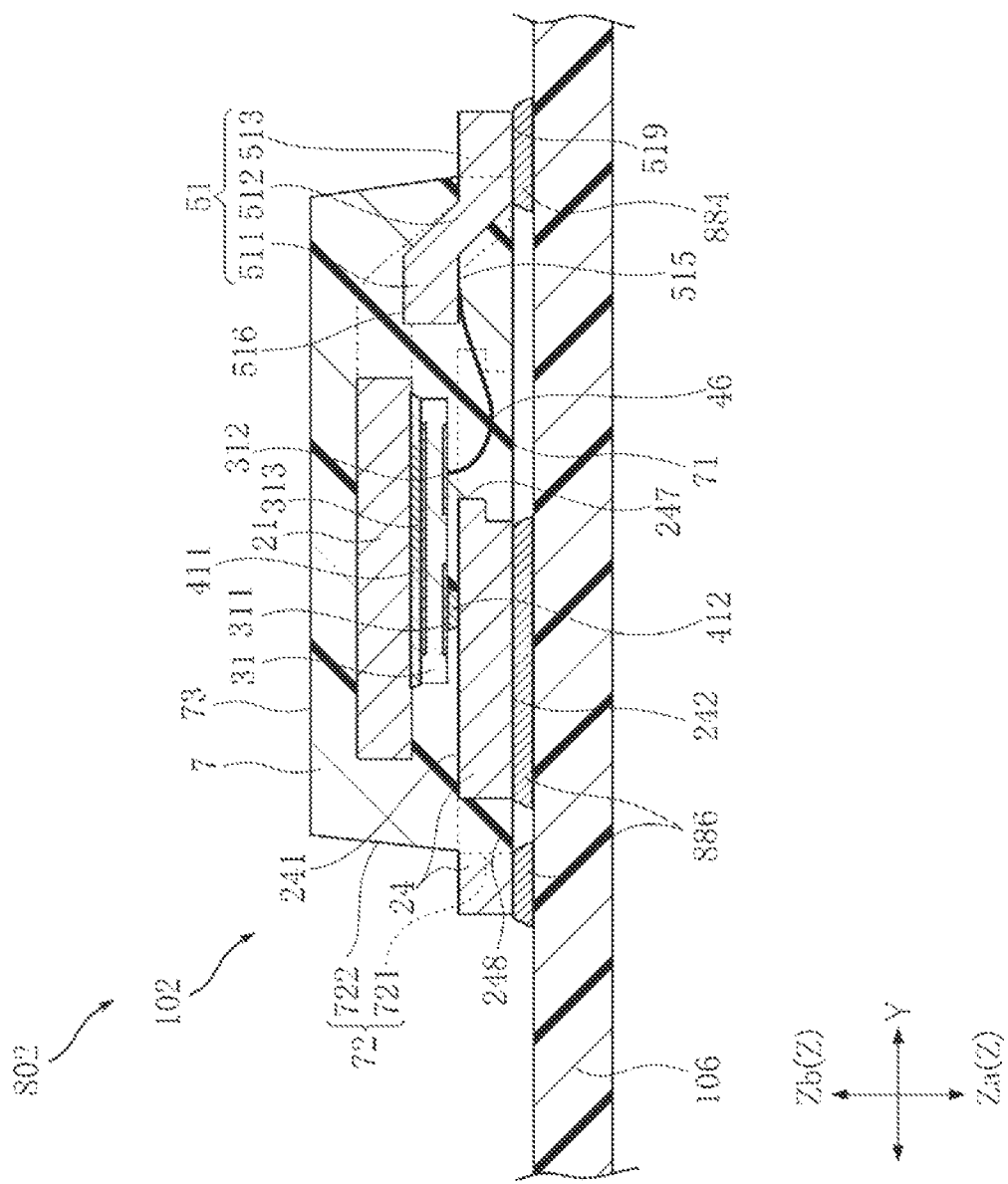
FIG. 19 is a section view taken along line XIX-XIX in FIG. 18.
Figure 20:
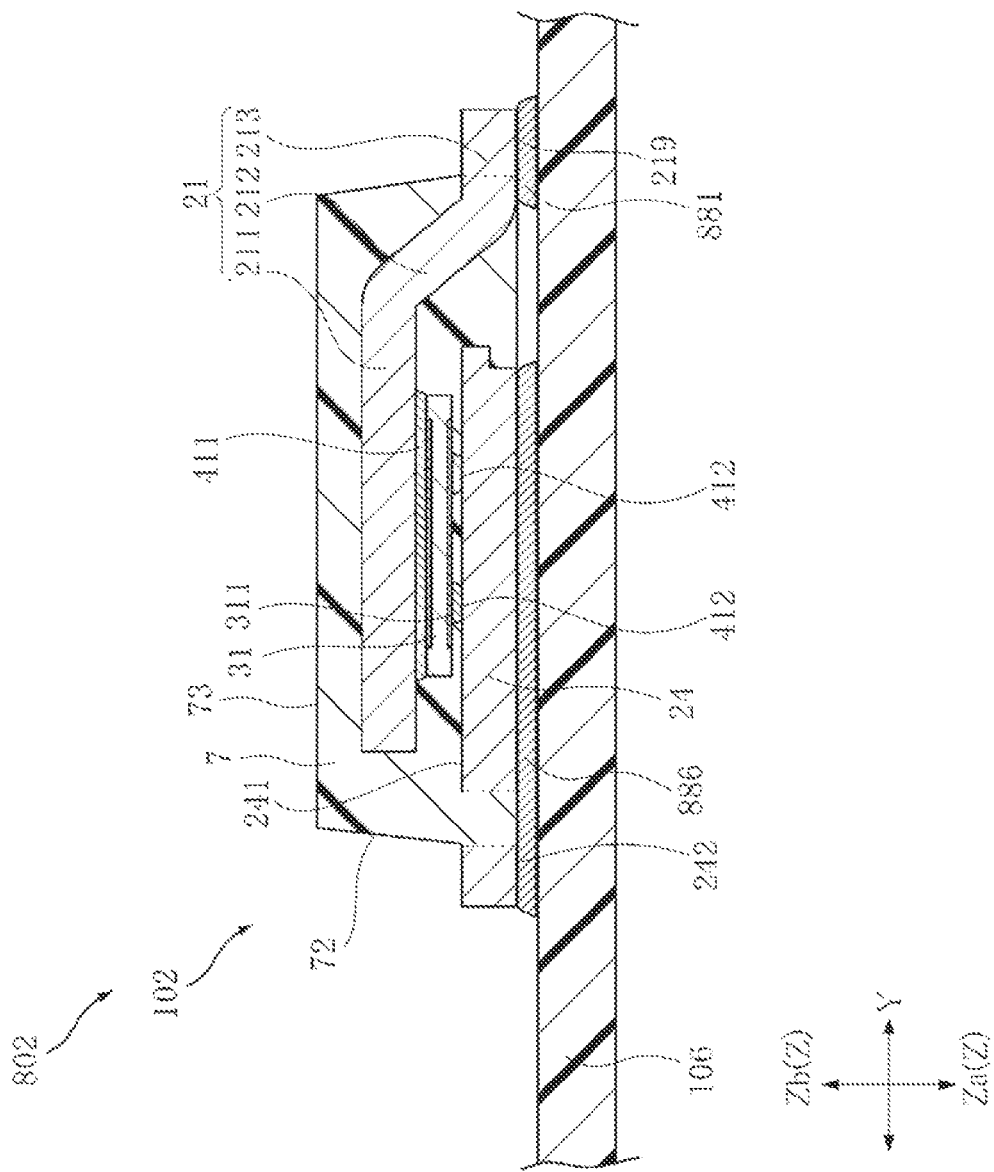
FIG. 20 is a section view taken along line XX-XX in FIG. 18.
Figure 21:
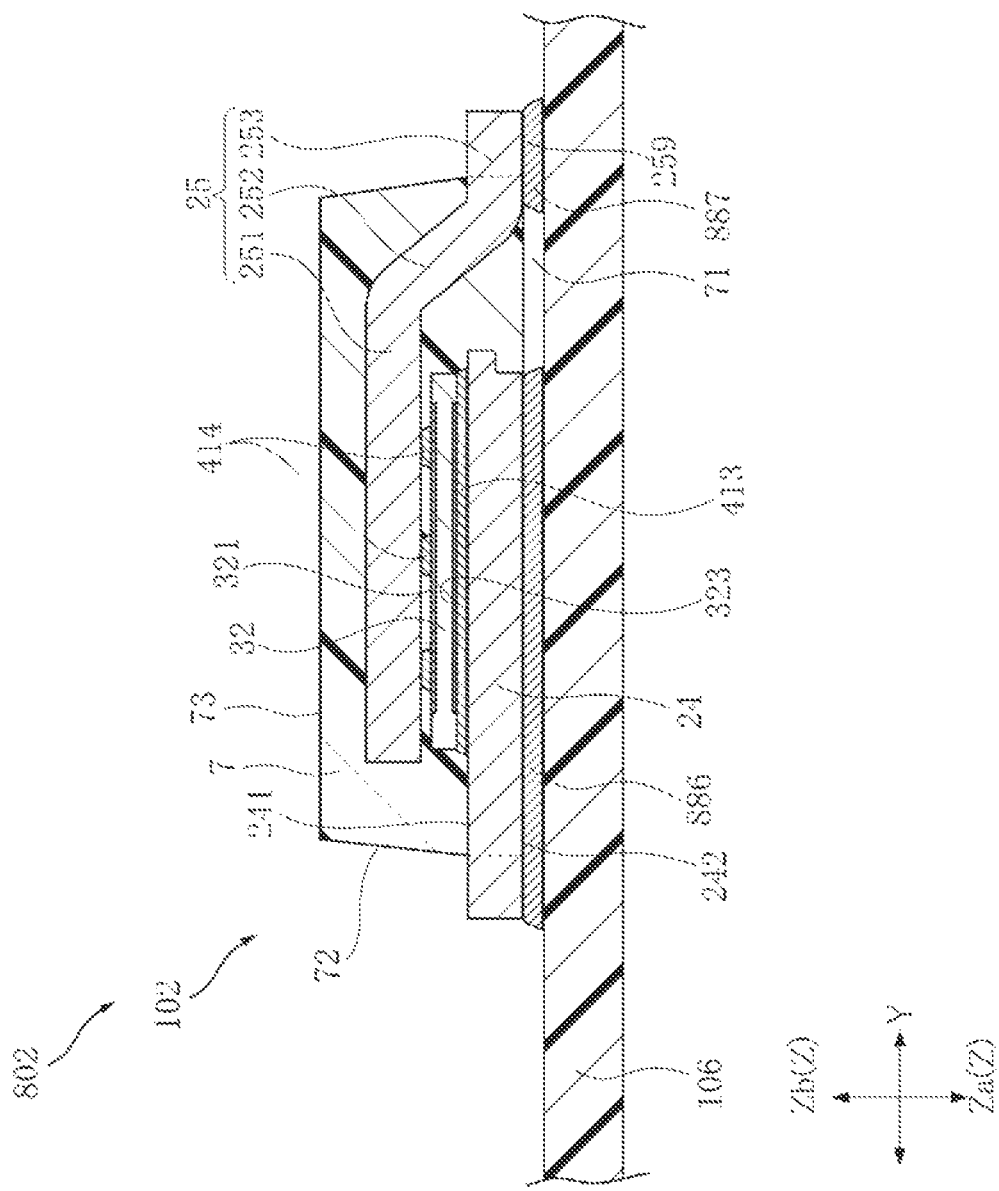
FIG. 21 is a section view taken along line XXI-XXI in FIG. 18.
Figure 22:
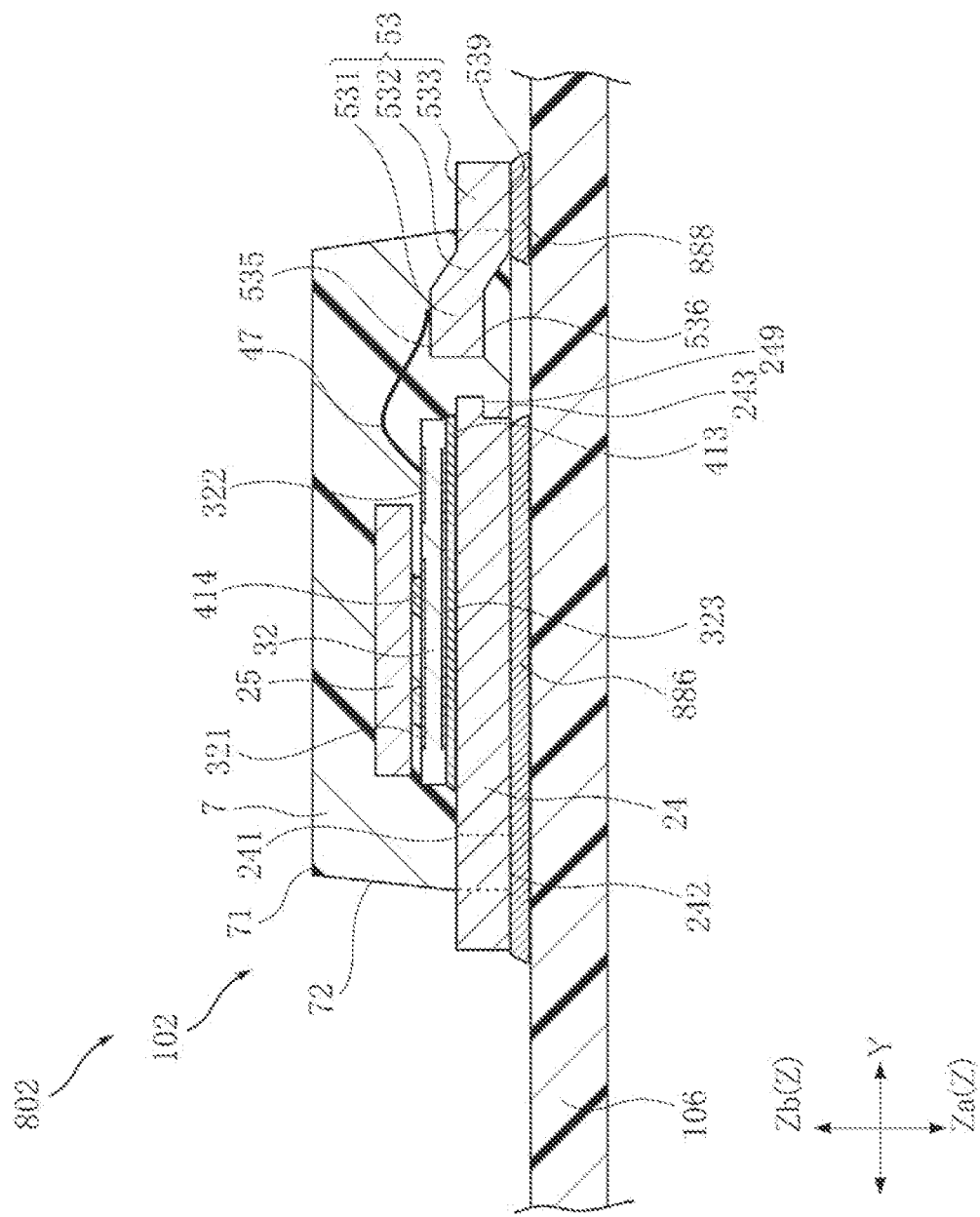
FIG. 22 is a section view taken along line XXII-XXII in FIG. 18.

FIG. 18 is a plan view showing a mounting structure according to some embodiments. FIG. 19 is a section view taken along line XIX-XIX in FIG. 18. FIG. 20 is a section view taken along line XX-XX in FIG. 18. FIG. 21 is a section view taken along line XXI-XXI in FIG. 18. FIG. 22 is a section view taken along line XXII-XXII in FIG. 18.

In some embodiments, the semiconductor chip 32 of a semiconductor device 102 may be arranged in a shifted position with respect to the semiconductor chip 31 when seen in the Z direction. The mounting structure 802 shown in FIGS. 18 through 22 includes a semiconductor device 102, a wiring substrate 106 and solder layers 881, 884, 886, 887 and 888.

The semiconductor device 102 is mounted on the wiring substrate 106. The solder layers 881, 884, 886, 887 and 888 are interposed between the semiconductor device 102 and the wiring substrate 106. The solder layers 881, 884, 886, 887 and 888 join the semiconductor device 102 and the wiring substrate 106 together.

Figure 23:
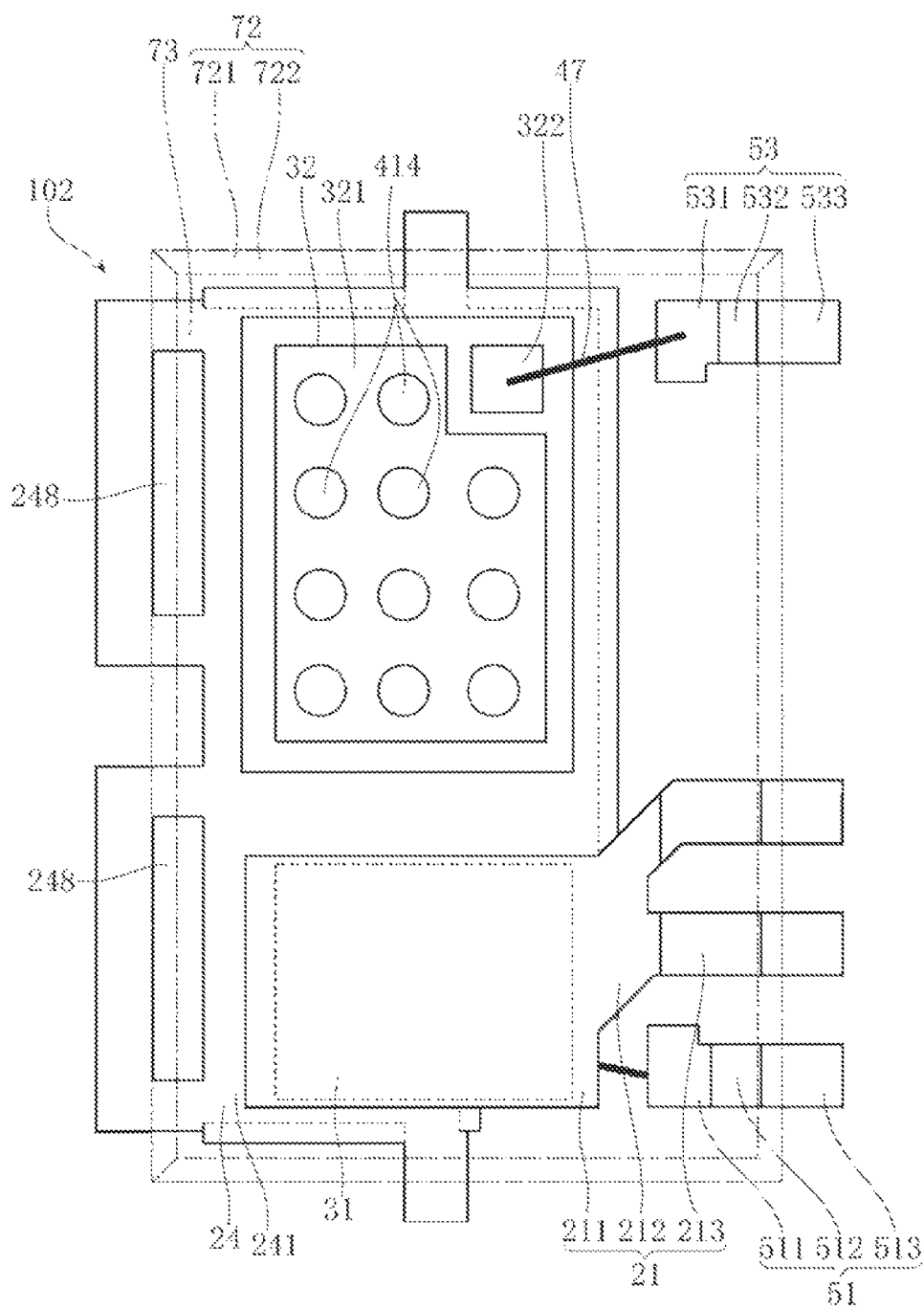
FIG. 23 is a view in which one conductor plate is omitted from the semiconductor device of the mounting structure shown in FIG. 18, according to some embodiments.
Figure 24:
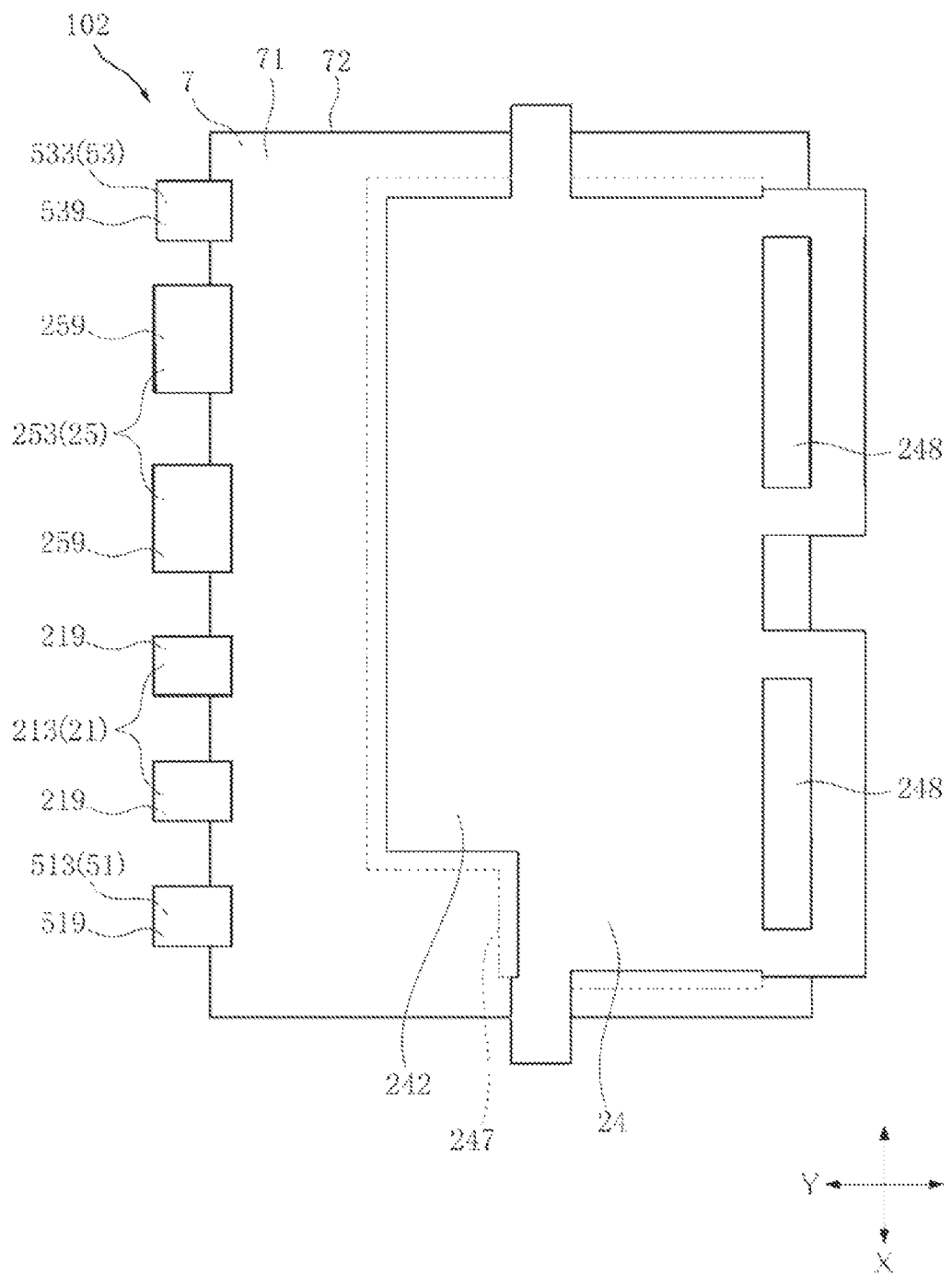
FIG. 24 is a bottom view showing a semiconductor device according to some embodiments.
Figure 25:
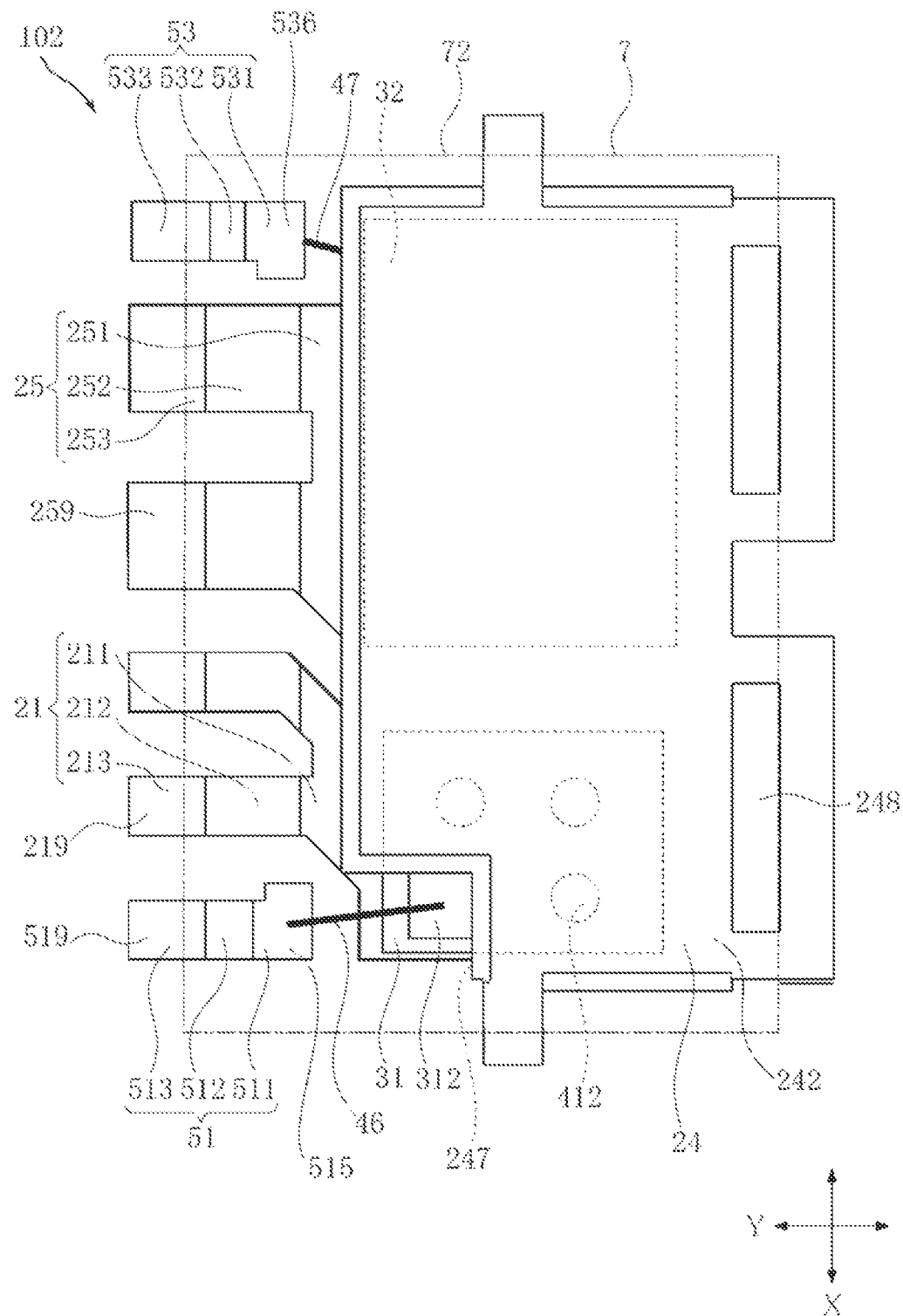
FIG. 25 is a view in which a resin is omitted from the semiconductor device shown in FIG. 24, according to some embodiments.
Figure 26:
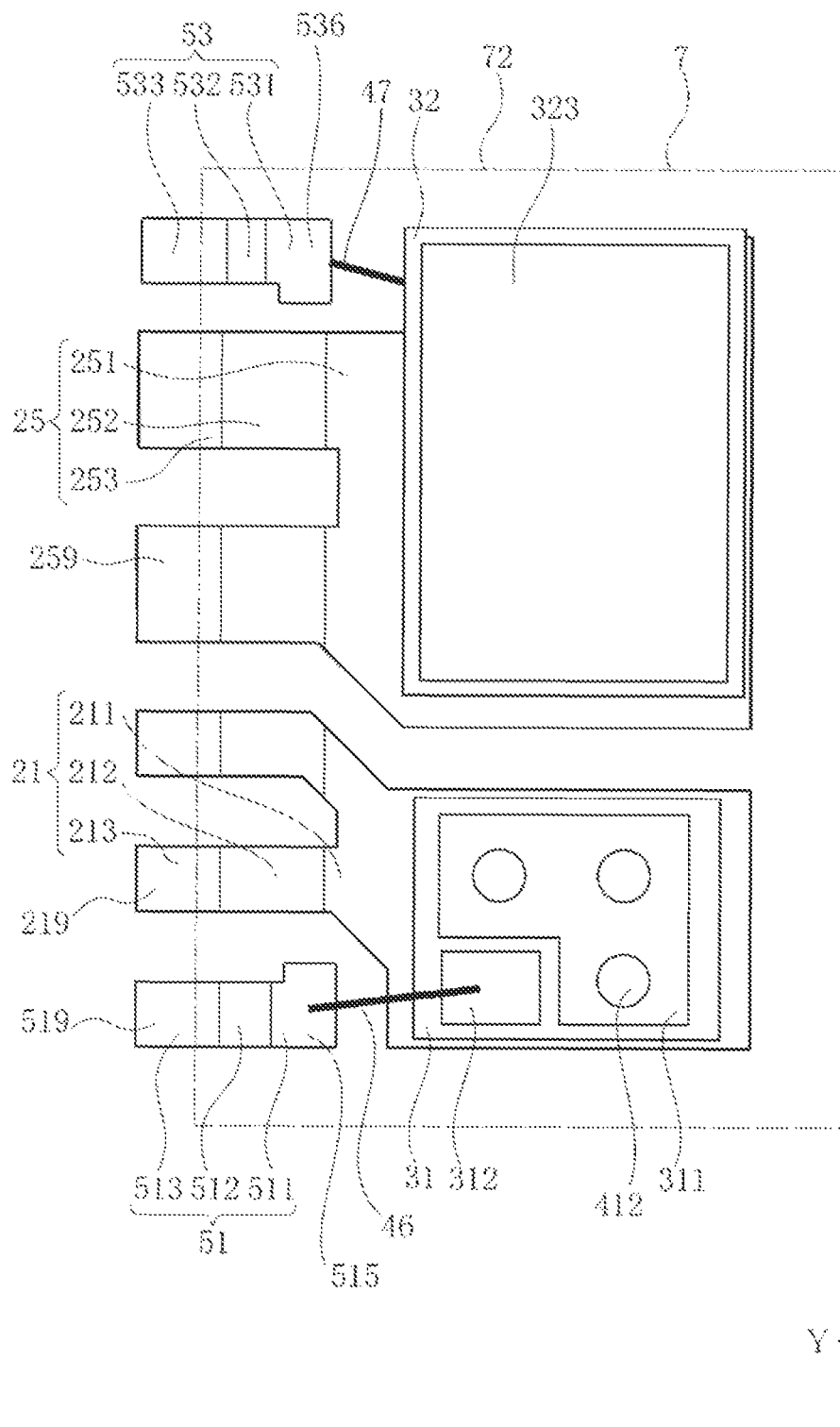
FIG. 26 is a view in which one conductor plate is omitted from the semiconductor device shown in FIG. 25, according to some embodiments.
Figure 27:
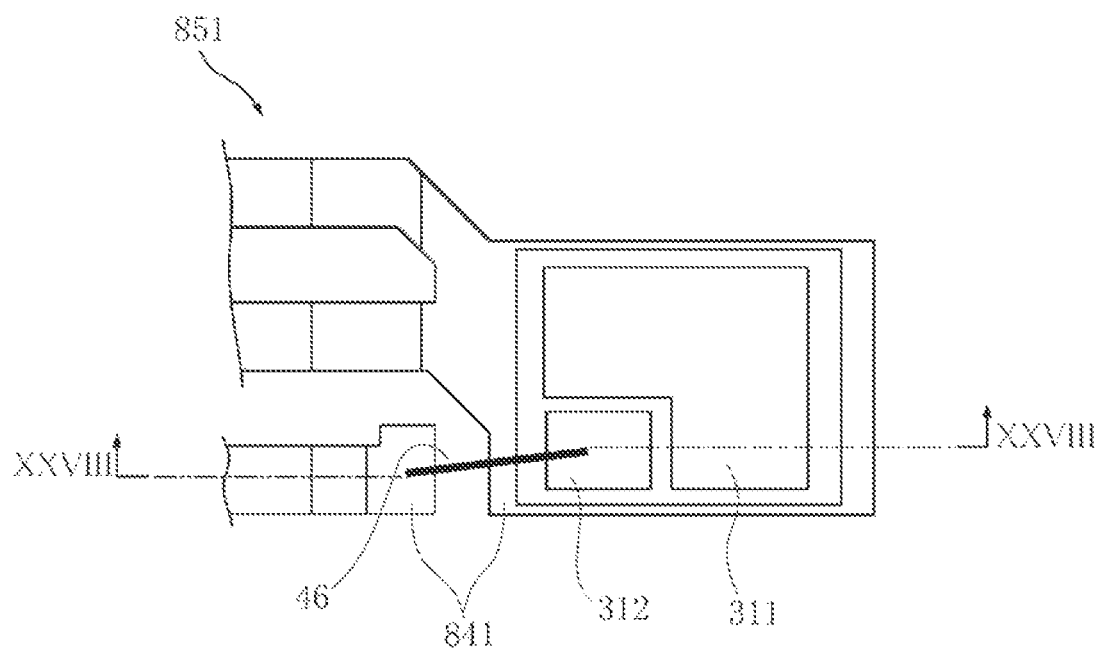
FIG. 27 is a plan view illustrating one step of a semiconductor device manufacturing method according to some embodiments.
Figure 28:
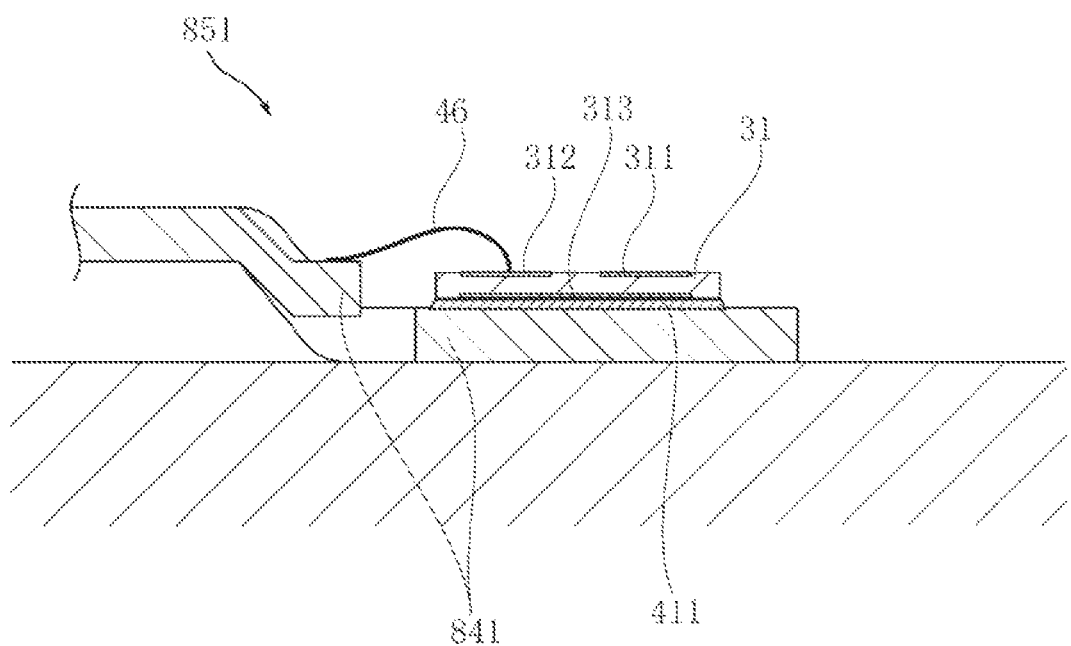
FIG. 28 is a section view taken along XXVIII-XXVIII in FIG. 27.

FIG. 23 is a view in which the conductor plate 25 is omitted from the semiconductor device 102 shown in FIG. 18. FIG. 24 is a bottom view of the semiconductor device 102. FIG. 25 is a view in which the resin 7 is omitted from the semiconductor device 102 shown in FIG. 24. FIG. 26 is a view in which the conductor plate 24 is omitted from the semiconductor device 102 shown in FIG. 25.

Like the semiconductor device 101, the semiconductor device 102 shown in FIGS. 23 through 26 is a DC/DC converter. The semiconductor device 102 makes up the same circuit as that shown in FIG. 8. The semiconductor device 102 includes conductor plates 21, 24 and 25, semiconductor chips 31 and 32, conductive joint portions 411 to 414, two wires 46 and 47, wire bonding leads 51 and 53, and a resin 7. In some embodiments, the conductor plate 21, the semiconductor chips 31 and 32, the conductive joint portions 411 to 414, the wires 46 and 47, and the wire bonding lead 51 will not be described because they have the same configurations as described in previous embodiments. Description will be made mainly on the conductor plates 24 and 25 and the wire bonding lead 53.

In some embodiments, the major surface electrodes 321 and 322 face toward the Zb direction. The rear surface electrode 323 faces the direction opposite to the direction which the major surface electrodes 321 and 322 face. In other words, the rear surface electrode 323 faces toward the Za direction.

The conductor plate 24 shown in FIGS. 18 through 24 is made of a conductor, e.g., Cu. The conductor plate 24 corresponds to one example of an electric connection member or a first conductor plate. The conductor plate 24 has a planar shape extending along the XY-plane. As shown in FIG. 18, the conductor plate 24 overlaps with the pad portion 212 when seen in the XY-plane. The semiconductor chip 31 is positioned between the conductor plate 24 and the pad portion 212. The conductor plate 24 is joined to the semiconductor chip 31 through the conductive joint portion 412 and is electrically connected to the semiconductor chip 31. As shown in FIGS. 19 through 22, the conductor plate 24 has a portion exposed from the resin 7. More specifically, the conductor plate 24 is exposed from the first region 721 of the resin side surface 72 and the resin bottom surface 71. The conductor plate 24 protrudes from the first region 721. In other embodiments, the conductor plate 24 may not protrude from the first region 721 but may have a side surface flush with the resin side surface 72.

The conductor plate 24 has a conductor surface 241 (first conductor surface) and a conductor surface 242 (second conductor surface). The conductor surfaces 241 and 242 have a planar shape extending along the XY-plane. The conductor surface 241 faces toward the Zb direction and the conductor surface 242 faces toward the Za direction. In other words, the conductor surfaces 241 and 242 face in the opposite direction from each other. The conductor surface 241 is joined to the major surface electrode 311 of the semiconductor chip 31 through the conductive joint portion 412. Thus, the conductor plate 24 is electrically connected to the major surface electrode 311 of the semiconductor chip 31. On the other hand, the conductor surface 242 is exposed from the resin bottom surface 71. The conductor surface 242 is flush with the resin bottom surface 71. The conductor surface 242 is joined to the wiring substrate 106 through the solder layer 886. The conductor surface 242 is electrically connected to the wiring layer of the wiring substrate 106 via the solder layer 886. As shown in FIGS. 24 and 25, a recess portion 247 is formed in the conductor plate 24. The recess portion 247 is recessed from the outside to the inside of the conductor plate 24 when seen in the XY-plane. The recess portion 247 overlaps with the major surface electrode 312 when seen in the XY-plane. A hole 248 is formed in the conductor plate 24. Like the hole 216 of some previous embodiments, the hole 248 is provided to enhance moisture resistance.

The conductor plate 25 corresponds to one example of a second conductor plate and is made of a conductor, e.g., Cu. The semiconductor chip 32 is joined to the conductor plate 25 through the conductive joint portion 414. The conductor plate 25 is formed by bending a single flat plate. In some embodiments, the conductor plate 25 and the conductor plate 21 are simultaneously formed by bending a single flat plate. The conductor plate 25 includes a pad portion 251, an intermediate portion 252 and a mounting portion 253.

The pad portion 251 has a planar shape extending along the XY-plane. The pad portion 251 overlaps with the conductor plate 24 when seen in the XY-plane. The semiconductor chip 32 is positioned between the pad portion 251 and the conductor plate 24. The pad portion 251 is joined to the semiconductor chip 32 through the conductive joint portion 414 and is electrically connected to the semiconductor chip 32. More specifically, the pad portion 251 is joined to the major surface electrode 321 of the semiconductor chip 32 through the conductive joint portion 414. Thus, the pad portion 251 is electrically connected to the major surface electrode 321 of the semiconductor chip 32. A recess portion 247 is formed in the pad portion 251. The recess portion 247 is recessed from the outside to the inside of the pad portion 251 when seen in the XY-plane. The recess portion 247 overlaps with the major surface electrode 322 when seen in the XY-plane.

As shown in FIG. 21, the intermediate portion 252 is positioned between the pad portion 251 and the mounting portion 253. The intermediate portion 252 is connected to both the pad portion 251 and the mounting portion 253. The intermediate portion 252 has a plate shape. In some embodiments, the intermediate portion 252 is inclined with respect to the pad portion 251. Moreover, the intermediate portion 252 is inclined with respect to the resin bottom surface 71. The intermediate portion 252 is shaped such that the intermediate portion 252 goes toward the Za direction as it extends away from the pad portion 251 when seen in the XY-plane.

The mounting portion 253 has a region exposed from the resin 7. More specifically, the mounting portion 253 is exposed from the first region 721 of the resin side surface 72 and the resin bottom surface 71. As shown in FIG. 21, the mounting portion 253 protrudes from the first region 721 toward one side in the Y direction. In other embodiments, the mounting portion 253 may not protrude from the first region 721 but may have a side surface flush with the resin side surface 72. The mounting portion 253 has a mounting surface 259. The mounting surface 259 is exposed from the resin bottom surface 71 and is flush with the resin bottom surface 71. The mounting surface 259 is joined to the wiring substrate 106 through the solder layer 887. The conductor plate 25 is electrically connected to the wiring layer of the wiring substrate 106 via the solder layer 887. As set forth above, the conductor plate 25 is formed by bending a single flat plate. Therefore, the thickness (Z-direction dimension) of the mounting portion 253 is equal to the thickness (Z-direction dimension) of the pad portion 251. In some embodiments, the conductor plate 25 and the conductor plate 21 are simultaneously formed by bending a single flat plate. Accordingly, the thickness (Z-direction dimension) of the mounting portion 253 is equal to the thickness (Z-direction dimension) of the mounting portion 213.

The wire bonding lead 53 shown in FIG. 22 has substantially the same configuration as the wire bonding lead 51. However, the facing direction of the pad major surface of the wire bonding lead 53, to which a wire is bonded, differs from that of the wire bonding lead 51. The wire bonding lead 53 will now be described in detail.

The wire bonding lead 53 is made of a conductor, e.g., Cu. The wire bonding lead 53 is formed by bending a single flat plate. In some embodiments, the wire bonding lead 53 and the conductor plate 24 are simultaneously formed by bending a single flat plate. The wire bonding lead 53 includes a pad portion 531, an intermediate portion 532 and a mounting portion 533.

The pad portion 531 has a pad major surface 535 and a pad rear surface 536. A wire 47 is bonded to the pad major surface 535. As shown in FIG. 22, the pad major surface 535 is positioned at the side closer to the major surface electrode 321 than the rear surface electrode 323 (at the Zb direction) along the Z-axis. On the other hand, the pad rear surface 536 faces in the direction opposite to the direction in which the pad major surface 535 faces. The pad rear surface 536 faces toward the side at which the resin bottom surface 71 is positioned. In some embodiments, as shown in FIG. 22, the pad rear surface 536 is arranged at the side of the resin bottom surface 71 with respect to the step surface 249 of the step portion 243 formed in the conductor plate 24. Accordingly, a heater used in bonding the wire 47 to the pad major surface 535 (when in use, the heater is arranged below the pad rear surface 536 in FIG. 22) nay be prevented from making contact with the conductor plate 24 even when the heater comes close to the conductor plate 24.

The intermediate portion 532 is positioned between the pad portion 531 and the mounting portion 533. The intermediate portion 532 is connected to both the pad portion 531 and the mounting portion 533, in some embodiments, the intermediate portion 532 is inclined with respect to the pad portion 531. The intermediate portion 532 is additionally inclined with respect to the resin bottom surface 71. The intermediate portion 532 is shaped such that the intermediate portion 532 goes toward the Za direction as it extends away from the pad portion 531 when seen in the XY-plane.

The mounting portion 533 has a region exposed from the resin 7. More specifically, the mounting portion 533 is exposed from the first region 721 of the resin side surface 72 and the resin bottom surface 71. As shown in FIGS. 18 and 22, the mounting portion 533 protrudes from the first region 721 toward one side in the Y direction. The mounting portion 533 protrudes from the first region 721 in the same direction as the mounting portion 532. In other embodiments, the mounting portion 533 may not protrude from the first region 721 but may have a side surface flush with the resin side surface 72. The mounting portion 533 has a mounting surface 539. The mounting surface 539 is exposed from the resin bottom surface 71 and is flush with the resin bottom surface 71. The mounting surface 539 is joined to the wiring substrate 106 through the solder layer 888. The wire bonding lead 53 is electrically connected to the wiring layer of the wiring substrate 106 via the solder layer 888. As set forth above, the wire bonding lead 53 is formed by bending a single flat plate. Therefore, the thickness (Z-direction dimension) of the mounting portion 533 is equal to the thickness (Z-direction dimension) of the pad portion 531. In some embodiments, the wire bonding lead 53 and the conductor plate 24 are simultaneously formed by bending a single flat plate. Accordingly, the thickness (Z-direction dimension) of the mounting portion 533 is equal to the thickness of the conductor plate 24.

Next, one example of a method for manufacturing the semiconductor device 102 is described briefly.

In manufacturing the semiconductor device 102, a first intermediate product 851 (see FIGS. 27 and 28), a second intermediate product 853 (see FIGS. 29 and 30) and a lead frame 845 (see FIGS. 31 and 32) are produced.

The first intermediate product 851 is produced in the same manner as described with respect to some previous embodiments.

Figure 29:
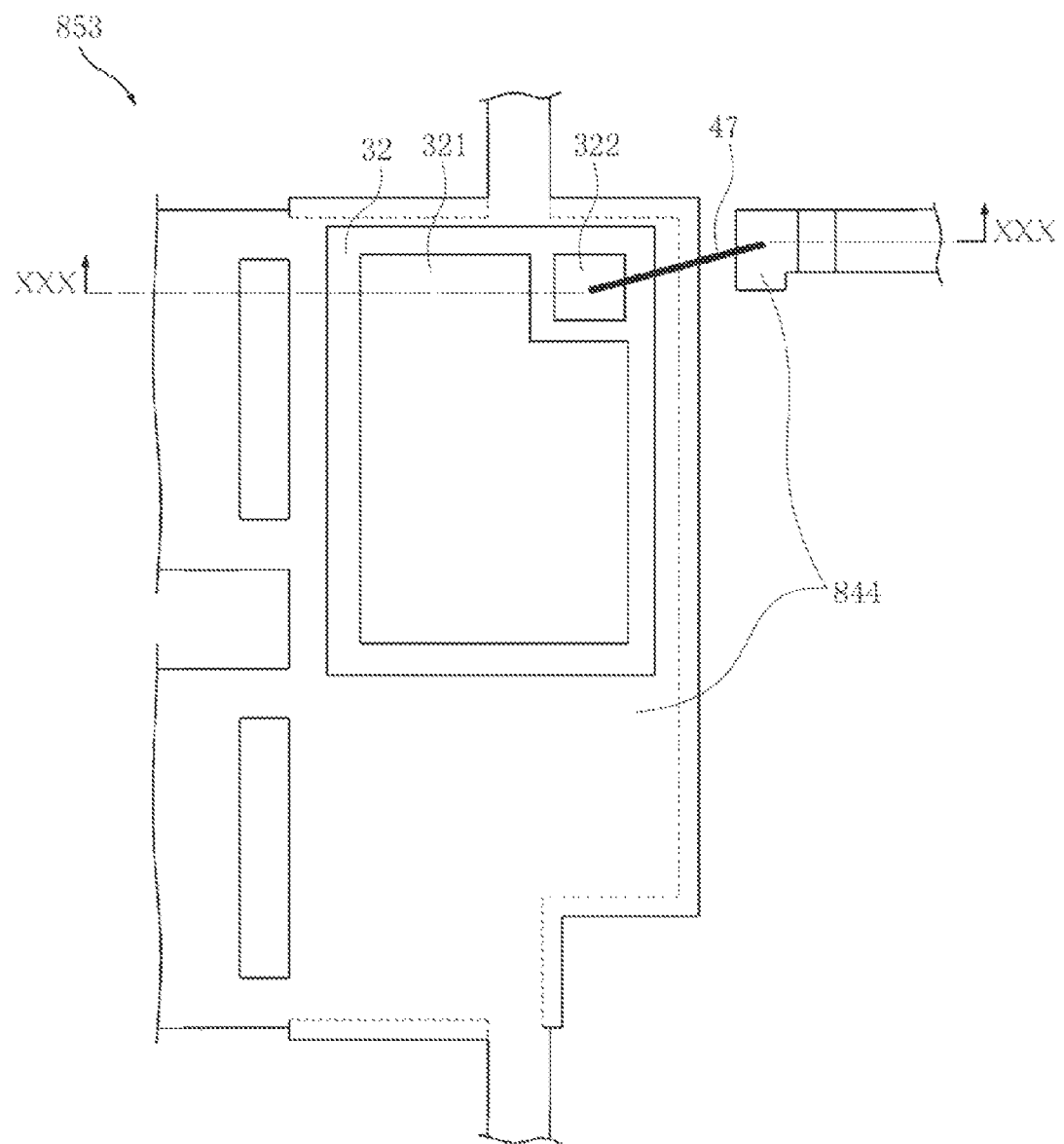
FIG. 29 is a plan view illustrating one step of the semiconductor device manufacturing method according to some embodiments.
Figure 30:
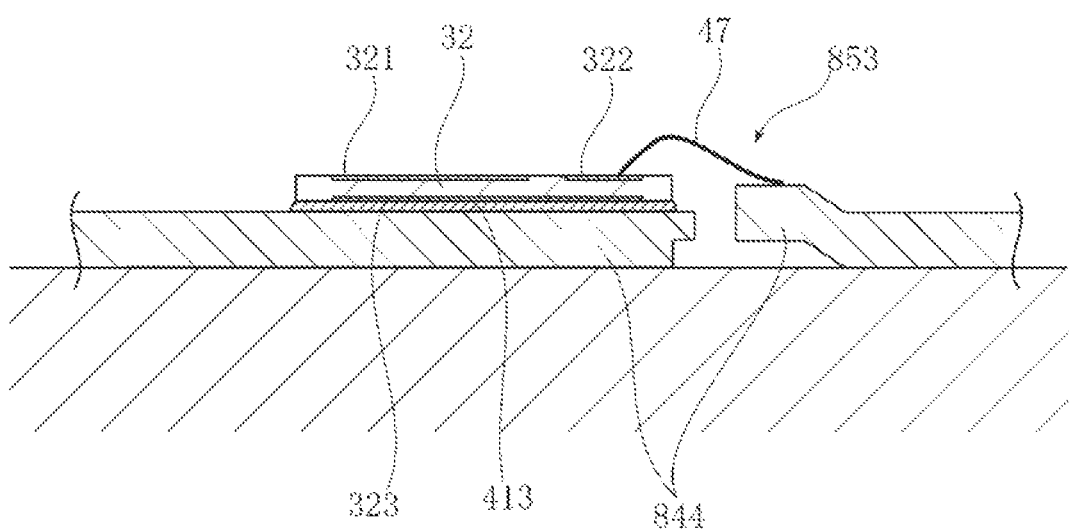
FIG. 30 is a section view taken along line XXX-XXX in FIG. 29.
Figure 31:
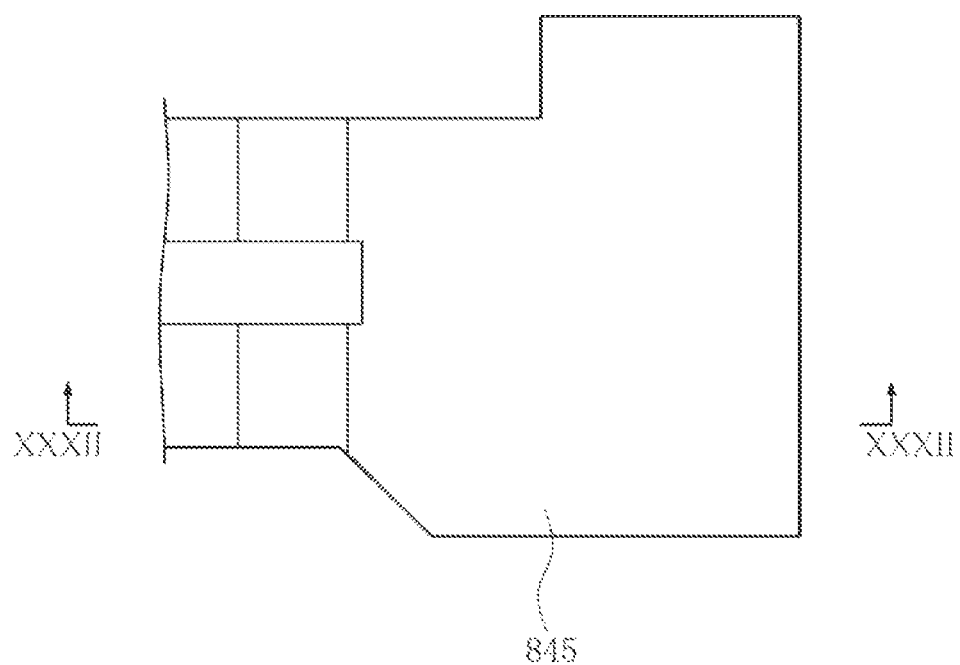
FIG. 31 is a plan view illustrating one step of the semiconductor device manufacturing method according to some embodiments.
Figure 32:
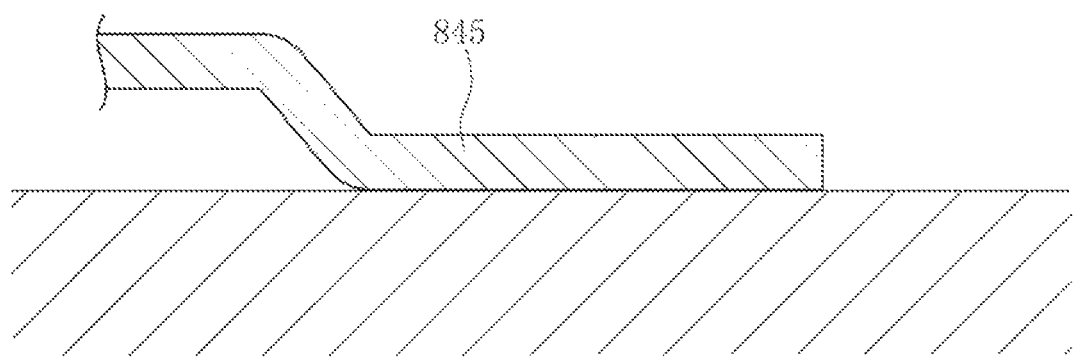
FIG. 32 is a section view taken along line XXXII-XXXII in FIG. 31.

For the production of the second intermediate product 853, a lead frame 844 shown in FIGS. 29 and 30 is formed from a single conductor plate. The lead frame 844 becomes the conductor plate 24 and the wire bonding lead 53 later in the manufacturing process. Then, the rear surface electrode 323 of the semiconductor chip 32 is joined to the lead frame 844 through the conductive joint portion 413. Subsequently, the wire 47 is bonded to the major surface electrode 322 of the semiconductor chip 32 and the lead frame 844. Thus, the second intermediate product 853 shown in FIGS. 29 and 30 is produced. The step of bonding the wire 47 is performed in a state that the major surface electrode 321 faces upwards in the gravitational direction.

The lead frame 845 is formed by bending a single conductor plate. The lead frame 845 becomes the conductor plate 25 later in the manufacturing process.

Figure 33:
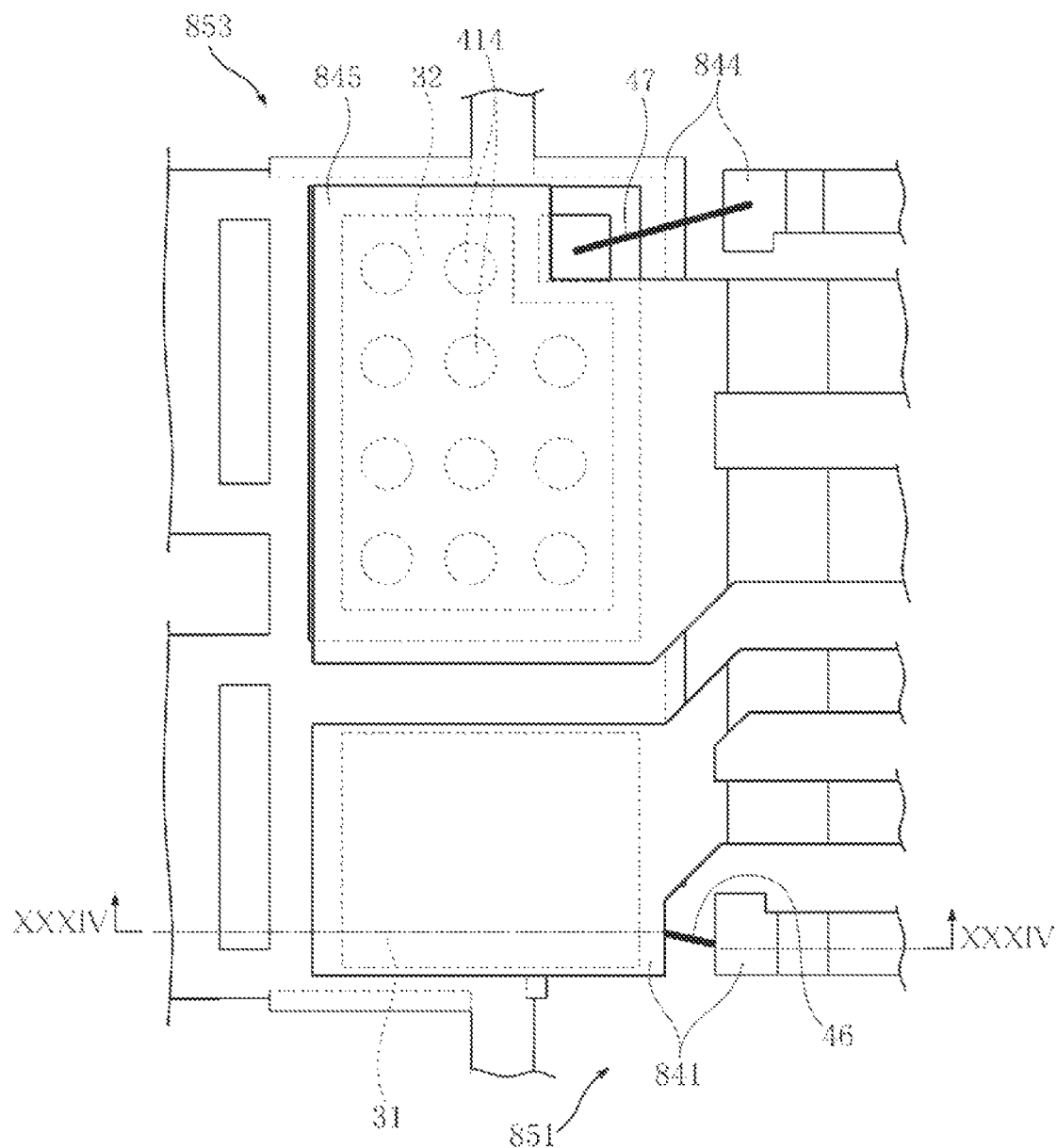
FIG. 33 is a plan view illustrating one step of the semiconductor device manufacturing method according to some embodiments.
Figure 34:
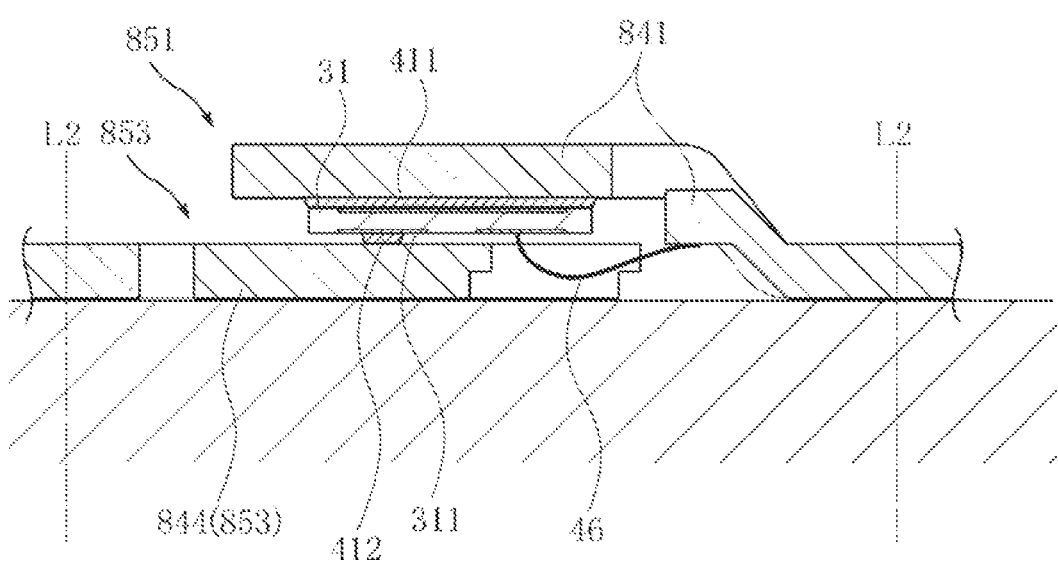
FIG. 34 is a section view taken along line XXXIV-XXXIV in FIG. 33.

Next, as shown in 33 and 34, the major surface electrode 311 of the semiconductor chip 31 is joined to the lead frame 844 of the second intermediate product 853 through the conductive joint portion 412. Similarly, as shown in FIG. 33, the lead frame 845 is joined to the major surface electrode 321 of the semiconductor chip 32 through the conductive joint portion 414.

Next, after forming the resin 7 (not shown in describing the manufacturing method), the lead frames 841, 844 and 845 are cut along the lines 12, thereby manufacturing the semiconductor device 102 shown in FIG. 19 and other figures.

In the semiconductor device 102, the major surface electrode 311 of the semiconductor chip 31 and the semiconductor chip 32 are all joined to the conductor plate 24. With this configuration, the semiconductor chips 31 and 32 are electrically connected to each other via the conductor plate 24. This eliminates the need to electrically interconnect the semiconductor chips 31 and 32 via wiring lines arranged outside the semiconductor device 102. If the need to use the wiring lines arranged outside the semiconductor device 101 is eliminated, the wiring resistance and wiring inductance of a route for the electric connection of the semiconductor chips 31 and 32 becomes the resistance and inductance of the conductor plate 24. This assists in reducing the wiring resistance and wiring inductance of the circuit made up of the semiconductor device 102. Accordingly, the semiconductor device 102 may reduce power consumption and enhance performance.

In the semiconductor device 102, as shown in FIG. 19, the wire 46 bonded to the major surface electrode 312 has a portion overlapping, in the Z direction, with the conductor plate 24 joined to the major surface electrode 311. With this configuration, for the same reasons as described with respect to some previous embodiments, the thickness of the semiconductor device 102 may be reduced. Similarly, in the semiconductor device 102, the wire 47 bonded to the major surface electrode 322 has a portion overlapping, in the Z direction, with the conductor plate 25 joined to the major surface electrode 321. With this configuration, for the same reasons noted above, the size of the semiconductor device 102 may be reduced.

In the semiconductor device 102, as shown in FIG. 19, the pad major surface 515 is positioned at the side closer to the major surface electrode 311 than the rear surface electrode 313 (toward the Za direction) along the Z-axis. With this configuration, for the same reasons as described with respect to previous embodiments, the wire 46 may be prevented from making contact with the semiconductor chip 31. Similarly, in the semiconductor device 102, as shown in FIG. 22, the pad major surface 535 is positioned at the side closer to the major surface electrode 321 than the rear surface electrode 323 (toward the Zb direction) along the Z-axis. This configuration helps prevent the wire 47 from making contact with the semiconductor chip 32.

With the semiconductor device 102, for the same reasons as described with respect to previous embodiments, the capillary (not shown) used in bonding the wire 46 to the pad portion 511 may be prevented from making contact with the intermediate portion 512. Similarly, in the semiconductor device 102, the wire bonding lead 53 includes the intermediate portion 532 positioned between the pad portion 531 and the mounting portion 533. The intermediate portion 532 is inclined with respect to the resin bottom surface 71. With this configuration, the capillary (not shown) used in bonding the wire 47 to the pad portion 531 may be prevented from making contact with the intermediate portion 532.

In the semiconductor device 102, as shown in FIG. 22, the pad rear surface 536 faces the direction opposite to the direction which the pad major surface 535 faces. The pad rear surface 536 faces toward the side of the resin bottom surface 71. With this configuration, the pad rear surface 536 is spaced apart from the resin bottom surface 71 in the direction and is not exposed from the resin bottom surface 71. Therefore, the solder layer 888 is not joined to the pad rear surface 536 but is joined to the mounting surface 539 spaced apart farther from the conductor plate 24 than the pad rear surface 536. This allows for an increase in the spaced-apart distance between the solder layer 888 and the solder layer 886 joined to the conductor plate 24. If the spaced-apart distance between the solder layers 888 and 886 may be increased, the solder layers 888 and 886 may be prevented from unintentionally making contact with each other. This allows for the solder layers 888 and 886 to be prevented from becoming a short-circuit.

Third Embodiment

Additional embodiments are described with reference to FIGS. 35 through 38.

Figure 35:
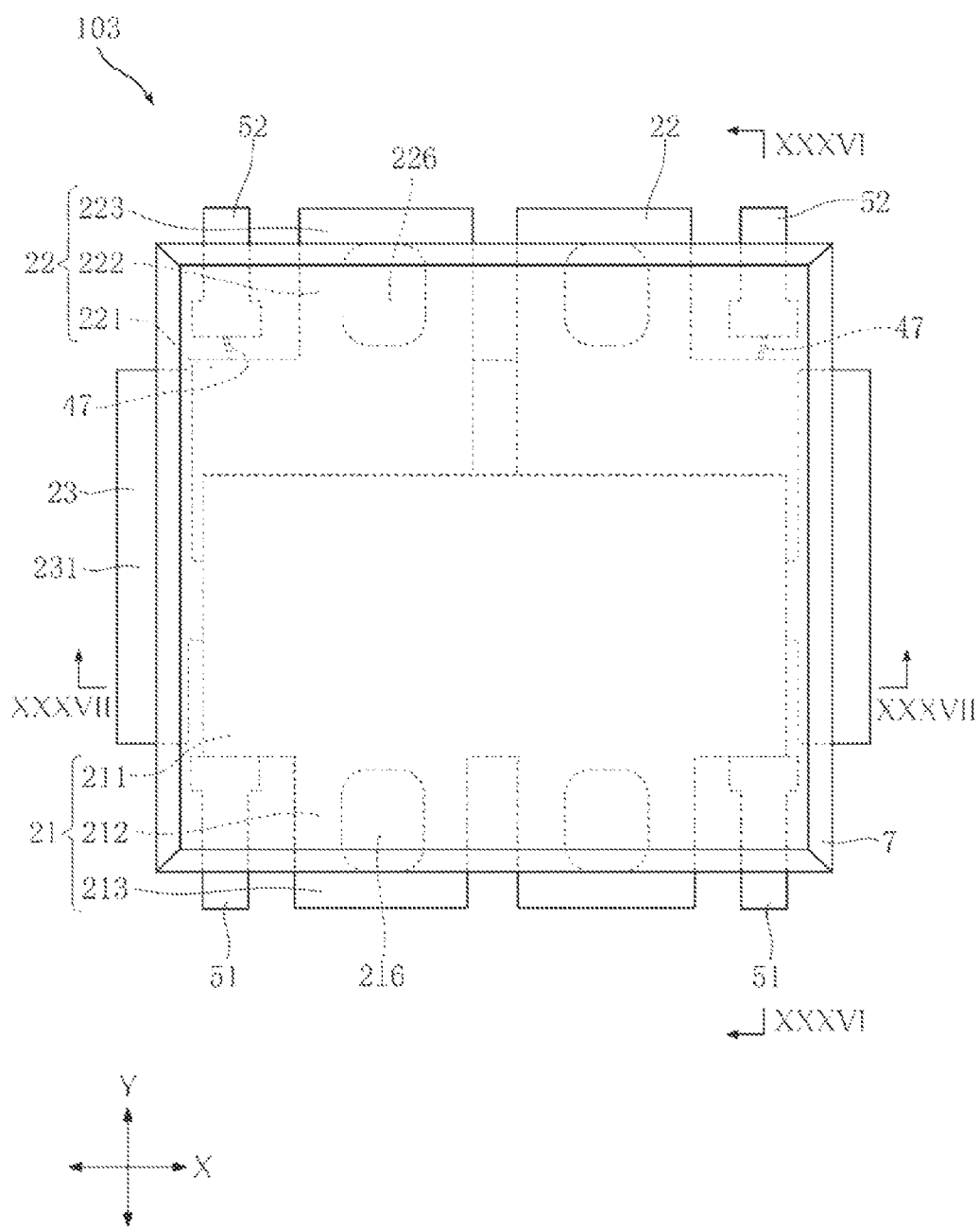
FIG. 35 is a plan view showing a semiconductor device according to some other embodiment.
Figure 38:
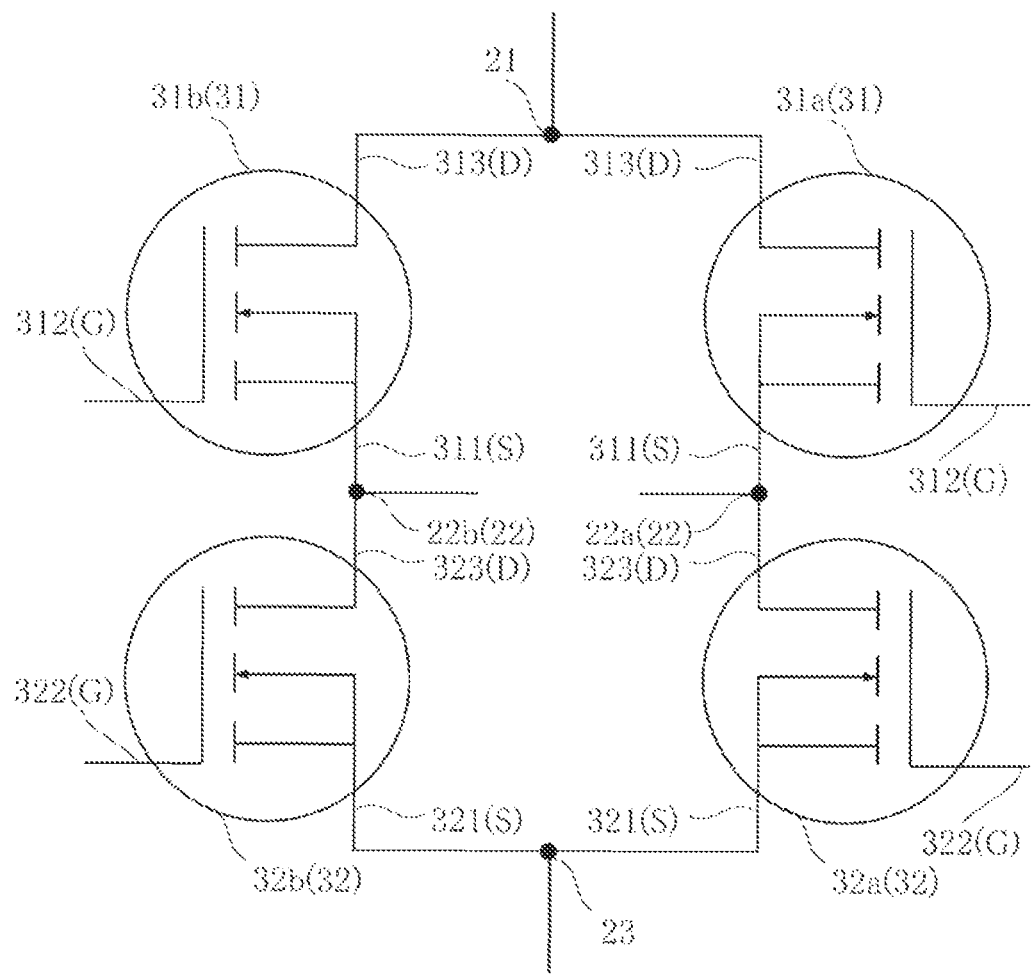
FIG. 38 is circuit diagram showing a circuit made up of the semiconductor device according to some embodiments.

FIG. 35 is a plan view showing a semiconductor device according to some embodiments. FIG. 36 is a section view taken along line XXXVI-XXXVI in FIG. 35. FIG. 37 is a section view taken along line XXXVII-XXXVII in FIG. 35. FIG. 38 is a circuit diagram of a circuit made up of the semiconductor device according to some embodiments.

The semiconductor device 103 shown in FIGS. 35 through 38 differs from the aforementioned semiconductor device 101 in at the semiconductor device 103 includes two semiconductor chips 31, two semiconductor chips 32, two conductor plates 22, two wire bonding leads 51 and two wire bonding leads 52. As shown in FIG. 38, the semiconductor device 103 may be configured as a full-bridge circuit. In some embodiments, one of the two semiconductor chips 31 is referred to as semiconductor chip 31a and the other as semiconductor chip 311. Likewise, one of the two semiconductor chips 32 is referred to as semiconductor chip 32a and the other as semiconductor chip 32b.

In the semiconductor device 103, the conductor plate 21 is joined to the semiconductor chips 31a and 31h. Accordingly, as shown in FIG. 38, the rear surface electrodes 313 (drain electrodes) of the semiconductor chips 31a and 31b are electrically connected to each other. The conductor plate 23 is joined to the semiconductor chips 31a and 31b. Therefore, as shown in FIG. 38, the major surface electrodes 321 (source electrodes) of the semiconductor chips 31a and 31b are electrically connected to each other. Furthermore, as shown in FIG. 38, the major surface electrode 311 (source electrode) of the semiconductor chip 31a and the rear surface electrode 323 (drain electrode) of the semiconductor chip 32a are electrically connected to each other. Similarly, the major surface electrode 311 of the semiconductor chip 31b and the rear surface electrode 323 of the semiconductor chip 32b are electrically connected to each other.

In some embodiments, the wiring resistance and wiring inductance of a circuit made up of the semiconductor device 103 may be reduced. Accordingly, the semiconductor device 103 may reduce power consumption and enhance performance.

Fourth Embodiment

More embodiments are described with reference to FIGS. 39 through 42.

Figure 39:
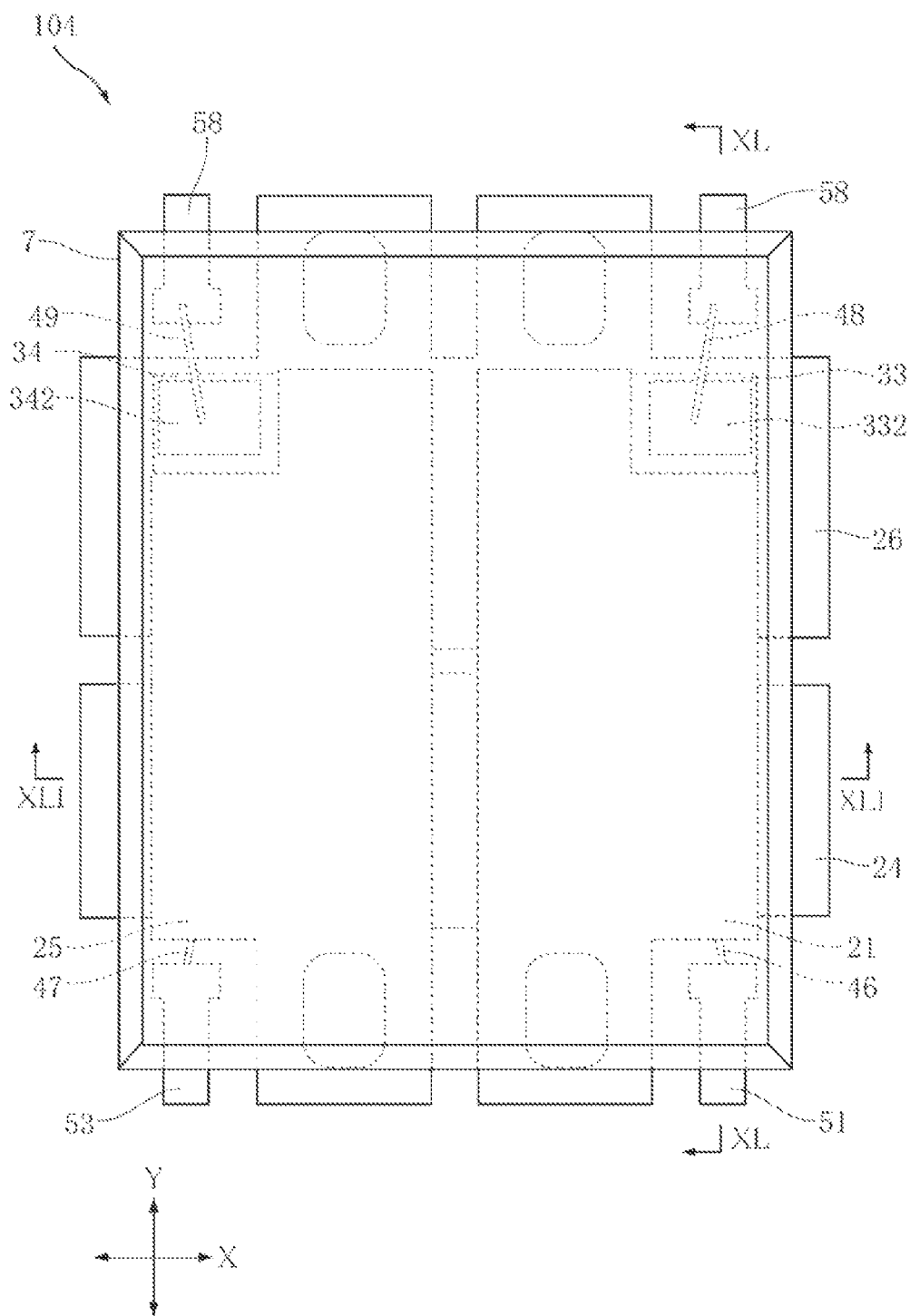
FIG. 39 is a plan view showing a semiconductor device according to some other embodiments.
Figure 40:
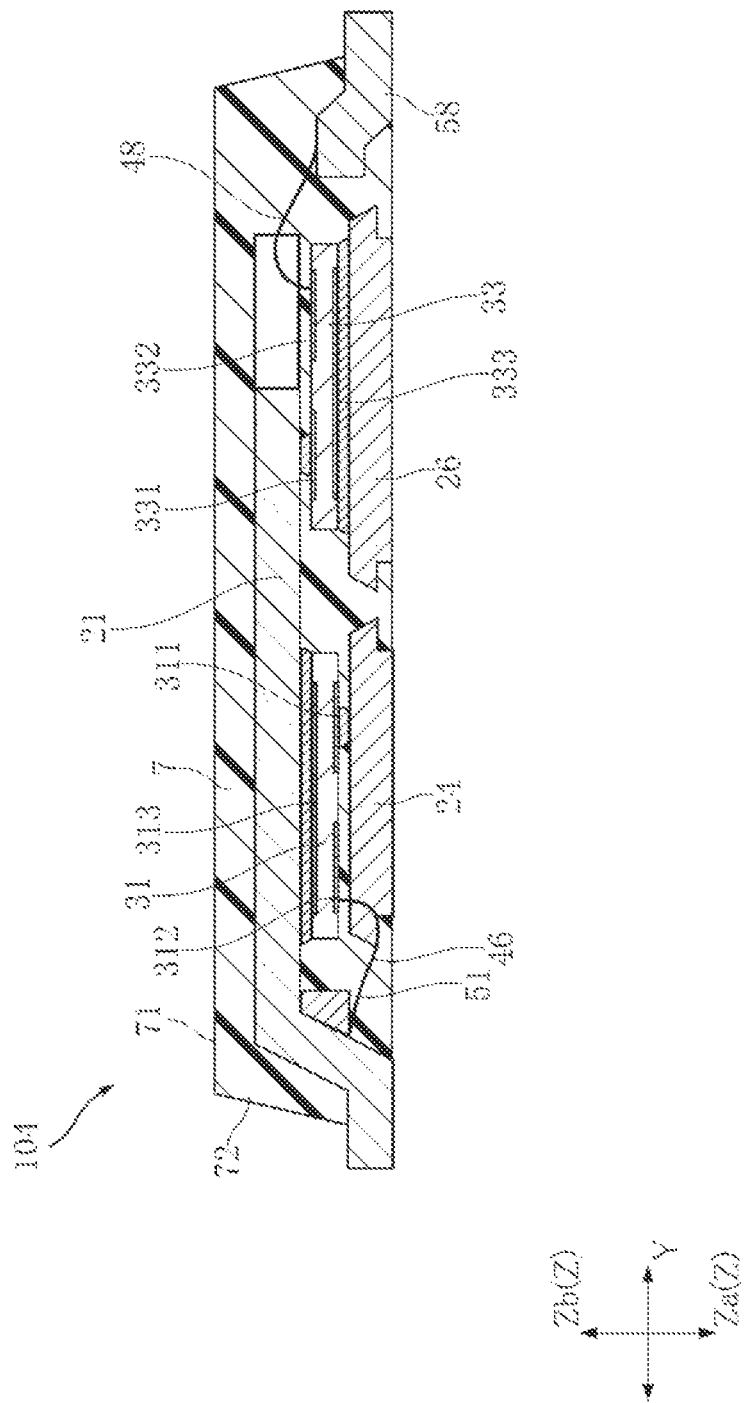
FIG. 40 is a section view taken along line XL-XL in FIG. 39.
Figure 41:
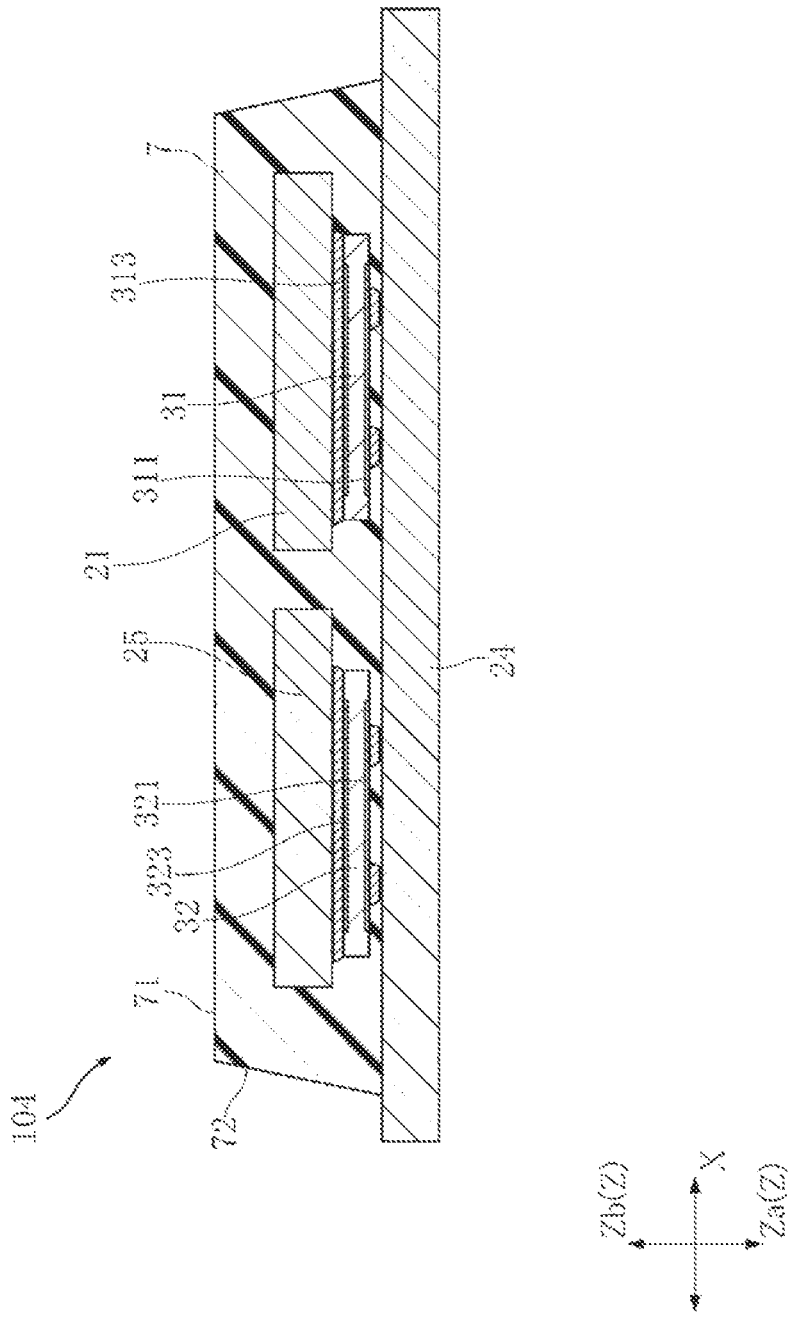
FIG. 41 is a section view taken along line XLI-XLI in FIG. 39.
Figure 42:
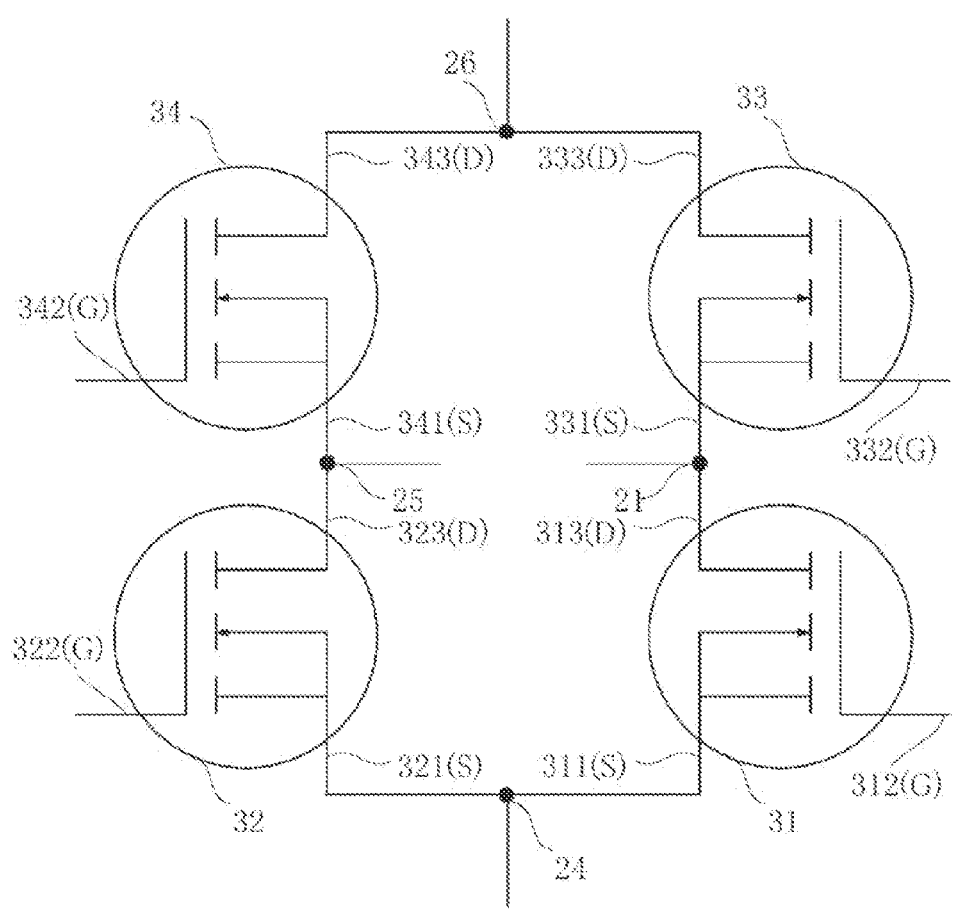
FIG. 42 is circuit diagram showing a circuit made up of the semiconductor device according to some embodiments.

FIG. 39 is a plan view showing a semiconductor device according to some embodiments. FIG. 40 is a section view taken along line XL-XL in FIG. 39. FIG. 41 is a section view taken along line XLI-XLI in FIG. 39. FIG. 42 is a circuit diagram of a circuit made up of the semiconductor device, according to some embodiments.

The semiconductor device 104 shown in FIGS. 39 through 42 differs from the aforementioned semiconductor device 102 in that the semiconductor device 104 further includes a conductor plate 26, semiconductor chips 33 and 34, wires 48 and 49 and a wire bonding lead 58. As shown in FIG. 42, the semiconductor device 104 makes up a full-bridge circuit. In some embodiments, as shown in FIG. 41, the major surface electrode 311 of the semiconductor chip 31 and the major surface electrode 321 of the semiconductor chip 32 face the same direction (toward the Za direction).

The semiconductor chips 33 and 34 are transistors. The rear surface electrode 333 of the semiconductor chip 33 and the rear surface electrode 343 of the semiconductor chip 34 are joined to the conductor plate 26 through conductive joint portions (partially not shown). Therefore, as shown in FIG. 42, the rear surface electrodes 333 and 334 (drain electrodes) are electrically connected to each other. The major surface electrode 331 of the semiconductor chip 33 is bonded to the conductor plate 21. Accordingly, as shown in FIG. 42, the major surface electrode 331 (source electrode) of the semiconductor chip 33 is electrically connected to the rear surface electrode 313 (drain electrode) of the semiconductor chip 31. The major surface electrode 341 of the semiconductor chip 34 is joined to the conductor plate 25. Therefore, as shown in FIG. 42, the major surface electrode 341 (source electrode) of the semiconductor chip 34 is electrically connected to the rear surface electrode 323 (drain electrode) of the semiconductor chip 32. The wire 48 interconnects the major surface electrode 332 of the semiconductor chip 33 and the wire bonding lead 58. The wire 49 interconnects the major surface electrode 342 of the semiconductor chip 34 and the wire bonding lead 58.

In some embodiments, the wiring resistance and wiring inductance of a circuit of the semiconductor device 104 may be reduced. Accordingly, the semiconductor device 104 in reduce power consumption and enhance performance.

Fifth Embodiment

Figure 44:
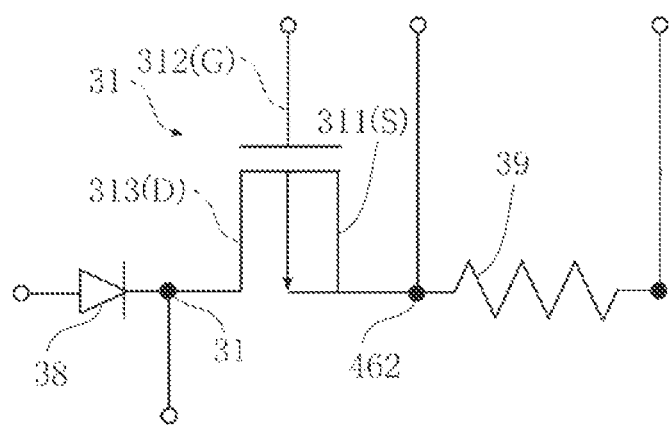
FIG. 44 is circuit diagram showing a circuit made up of the semiconductor device according to some embodiments.

More embodiments are described with reference to FIGS. 43 and 44.

FIG. 43 is a section view showing a semiconductor device according to some embodiments. FIG. 44 is circuit diagram showing a circuit made up of the semiconductor device according to some embodiments.

The semiconductor device 105 includes conductor plates 21, 28 and 29, a semiconductor chip 31, a diode 38, a resistor 39, conductive joint portions 411, 421 and 422, wires 46 and 461, an electric connection member 462, wire bonding leads 51 and 59, and a resin 7. The conductor plate 21, the semiconductor chip 31, the conductive joint portion 411, the wire 46, the wire bonding lead 59 and the resin 7 have the same configurations as those of some previously described embodiments and therefore will not be described. The semiconductor device 105 is an over-current protection circuit and is often arranged around a DC/DC converter.

The conductor plates 28 and 29 are made of a conductor, e.g., Cu. The conductor plates 28 and 29 are exposed from the resin bottom surface 71. The diode 38 is joined to the conductor plate 21 through the conductive joint portion 421. Therefore, as shown in FIG. 44, the diode 38 is electrically connected to the rear surface electrode 313 (drain electrode, in some embodiments) of the semiconductor chip 31. The resistor 39 is joined to the conductor plates 28 and 29 through the conductive joint portion 422. Thus, the resistor 39 is electrically connected to the conductor plates 28 and 29. The electric connection member 462 is joined to the major surface electrode 311 of the semiconductor chip 31 and one end of the resistor 39. Therefore, as shown in FIG. 44, the major surface electrode 311 (source electrode, in some embodiments) of the semiconductor chip 31 is electrically connected to the resistor 39 via the electric connection member 462. The electric connection member 462 is made of a conductor, e.g., Cu. The wire 46 has a portion overlapping with the electric connection member 462 in the Z direction and a portion overlapping with the resistor 39 in the Z direction. The diode 38 and the resistor 39 are examples of a functional element chip.

The wire bonding lead 59 has the same configuration as that of the wire bonding lead 51 and therefore will not be described. The wire 461 is bonded to the wire bonding lead 59 and the diode 38.

In the semiconductor device 105, the major surface electrode 311 of the semiconductor chip 31 and the resistor 39 are all joined to the electric connection member 462. With this configuration, the semiconductor chip 31 and the resistor 39 are electrically connected to each other via the electric connection member 462. This eliminates the need to electrically interconnect the semiconductor chip 31 and the resistor 39 via wiring lines arranged outside the semiconductor device 105. If the need to use the wiring lines arranged outside the semiconductor device 105 is eliminated, the wiring resistance and wiring inductance of a route for the electric connection of the semiconductor chip 31 and the resistor 39 becomes the resistance and inductance of the electric connection member 462. This assists in reducing the wiring resistance and wiring inductance of the circuit made up of the semiconductor device 105. Accordingly, the semiconductor device 105 may reduce power consumption and enhance performance.

In the semiconductor device 105, the wire 46 bonded to the major surface electrode 312 has a portion overlapping, in the Z direction, with the electric connection member 462 joined to the major surface electrode 311. With this configuration, for the same reasons as mentioned with respect to the foregoing embodiments, the thickness of the semiconductor device 105 may be reduced. Similarly, the wire 46 has a portion overlapping with the resistor 39 in the Z direction. With this configuration, the thickness of the semiconductor device 105 may be reduced.

The present disclosure is not limited to the embodiments described above. The specific configurations of the respective components of the present disclosure can be changed to many different designs, or may be combined in any manner. The circuits that make up these semiconductor devices are not limited to those set forth above. The circuits may be, for example, a buffer circuit and a three-layer motor. The functional element chips described previously may, in addition to being a transistor, a diode and/or, a resistor, also be a capacitor.

While certain embodiments have been described, these embodiments have been presented by way of example only, and are not intended to limit the scope of the disclosures. Indeed, the novel devices and structures described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A semiconductor device, comprising:
    a plurality of functional element chips, including a first semiconductor chip and a second semiconductor chip;
    a first conductor plate configured to join to the first and second semiconductor chips;
    a second conductor plate configured to join to the second semiconductor chip, and including a step portion that prevents the second chip from falling down;
    a first wire; and
    a resin configured to cover the plurality of functional element chips, the first conductor plate and the first wire,
    wherein the first semiconductor chip includes a gate electrode, a source electrode and a drain electrode, and the gate and source electrodes are configured to face in a same first direction, and the drain electrode faces in a second direction opposite to the first direction,
    wherein the first conductor plate is joined to the source electrode, wherein the first wire is bonded to the gate electrode through a portion overlapping the first conductor plate in a thickness direction of the first semiconductor chip, and wherein the source electrode of the first semiconductor chip and a drain electrode of the second semiconductor chip are electrically connected via the first conductor plate.

2. The device of claim 1, further comprising:
a wire bonding lead exposed from the resin, the wire bonding lead including a pad portion having a pad major surface to which the first wire is bonded.

3. The device of claim 2, wherein the pad major surface is positioned at a side closer to the gate electrode than the drain electrode in the thickness direction.

4. The device of claim 2, wherein the resin has a resin bottom surface configured to face toward one side in the thickness direction, and the wire bonding lead includes a mounting portion exposed from the resin bottom surface.

5. The device of claim 4, wherein the mounting portion has a mounting surface flush with the resin bottom surface.

6. The device of claim 5, wherein the wire bonding lead includes an intermediate portion positioned between the pad portion and the mounting portion, the intermediate portion being inclined with respect to the resin bottom surface.

7. The device of claim 4, wherein the pad major surface faces toward a side where the resin bottom surface is located.

8. The device of claim 4, wherein the pad portion has a pad rear surface formed at an opposite side from the pad major surface, the pad rear surface faces toward a side where the resin bottom surface is located.

9. The device of claim 1, wherein the second semiconductor chip is arranged in a position shifted from the first semiconductor chip when seen in the thickness direction.

10. The device of claim 1, wherein the first conductor plate has a recess portion in which a portion of the first wire is arranged.

11. The device of claim 1, wherein the second semiconductor chip includes a source electrode and the drain electrode, the source electrode of the second semiconductor chip is configured to face in the first direction and the drain electrode of the second semiconductor chip is configured to face in a direction opposite to the first direction, wherein the source electrode of the second semiconductor chip is joined to the second conductor plate, and the drain electrode of the second semiconductor chip is joined to the first conductor plate.

12. The device of claim 11, wherein the second conductor plate has a first conductor surface joined to the source electrode of the second semiconductor chip and a second conductor surface facing in a direction opposite to a direction in which the first conductor surface faces, the second conductor surface being exposed from the resin.

13. The device of claim 12, wherein the first conductor surface has a portion protruding from the second conductor surface when seen in the thickness direction.

14. The device of claim 11, further comprising a second wire, wherein the second semiconductor chip includes a gate electrode configured to face in the first direction, the second wire being bonded to the gate electrode and the second wire overlapping with the second conductor plate in the thickness direction.

15. The device of claim 1, wherein the second semiconductor chip includes a source electrode, the source electrode of the second semiconductor chip being configured to face in the second direction, the drain electrode of the second semiconductor chip being configured to face in a direction opposite to the second direction, wherein the source electrode of the second semiconductor chip is joined to the second conductor plate, and the drain electrode of the second semiconductor chip is joined to the first conductor plate.

16. The device of claim 15, wherein the first conductor plate has a first conductor surface joined to the source electrode of the first semiconductor chip and a second conductor surface formed at an opposite side from the source electrode of the first semiconductor chip, the second conductor surface being exposed from the resin.

17. The device of claim 16, wherein the first conductor surface has a portion protruding from the second conductor surface when seen in the thickness direction.

18. The device of claim 15, further comprising a second wire, wherein the second semiconductor chip includes a gate electrode configured to face in the second direction, the second wire being bonded to the gate electrode of the second semiconductor chip and the second wire overlaps with the second conductor plate in the thickness direction.

19. The device of claim 1, wherein the first conductor plate has a hole that a portion of the resin fills.

20. The device of claim 1, wherein one of the functional element chips is a diode, a resistor or a capacitor.

21. A semiconductor device mounting structure, comprising:
the semiconductor device of claim 1;
a wiring substrate on which the semiconductor device is arranged; and
a solder layer interposed between the semiconductor device and the wiring substrate.

22. A semiconductor device, comprising:
a plurality of functional element chips including a first semiconductor chip and a second semiconductor chip, the first semiconductor chip including a gate electrode, a source electrode and a drain electrode, the gate and source electrodes facing in a same first direction, the drain electrode facing in a direction opposite to the first direction, the second semiconductor chip including a drain electrode;
a first conductor plate joining at least the first and second semiconductor chips of the plurality of functional element chips, the first conductor plate being joined to the source electrode, wherein the source electrode of the first semiconductor chip and the drain electrode of the second semiconductor chip are electrically connected via the first conductor plate;
a first wire being bonded to the gate electrode through a portion overlapping with the first conductor plate in a thickness direction of the first semiconductor chip; and
a resin configured to cover the plurality of functional element chips, the first conductor plate and the first wire.

* * * * *